United States Patent
Xi et al.

(10) Patent No.: US 10,826,539 B2
(45) Date of Patent: Nov. 3, 2020

(54) METHOD AND SYSTEM FOR ADVANCED OUTER CODING

(71) Applicant: IDAC HOLDINGS, INC., Wilmington, DE (US)

(72) Inventors: Fengjun Xi, San Diego, CA (US); Chunxuan Ye, San Diego, CA (US); Kyle Jung-Lin Pan, Saint James, NY (US); Hanqing Lou, Syosset, NY (US); Nirav B. Shah, San Diego, CA (US)

(73) Assignee: IDAC Holdings, Inc., Wilmington, DE (US)

( * ) Notice: Subject to any disclaimer, the term of this patent is extended or adjusted under 35 U.S.C. 154(b) by 93 days.

(21) Appl. No.: 16/300,377

(22) PCT Filed: May 9, 2017

(86) PCT No.: PCT/US2017/031727
§ 371 (c)(1),
(2) Date: Nov. 9, 2018

(87) PCT Pub. No.: WO2017/196827
PCT Pub. Date: Nov. 16, 2017

(65) Prior Publication Data
US 2019/0140784 A1    May 9, 2019

Related U.S. Application Data

(60) Provisional application No. 62/334,762, filed on May 11, 2016, provisional application No. 62/400,721, (Continued)

(51) Int. Cl.
*H03M 13/29* (2006.01)
*H03M 13/09* (2006.01)
(Continued)

(52) U.S. Cl.
CPC ..... *H03M 13/2942* (2013.01); *H03M 13/098* (2013.01); *H03M 13/2906* (2013.01);
(Continued)

(58) Field of Classification Search
CPC ....... H04L 1/1819; H04L 1/00; H04L 1/0063; H04L 5/0055; H04L 1/1671;
(Continued)

(56) References Cited

U.S. PATENT DOCUMENTS 7,698,290 B2    4/2010 Saito et al.
7,941,724 B2 *  5/2011 Chindapol ............ H04L 1/0041
                                                714/751
(Continued)

FOREIGN PATENT DOCUMENTS

CN    104301077 A    1/2015
EP    2 582 052      4/2013
(Continued)

OTHER PUBLICATIONS

El Hattachi et al., "NGMN 5G White Paper," Version 1.0 (Feb. 2015).
(Continued)

*Primary Examiner* — Hashim S Bhatti
(74) *Attorney, Agent, or Firm* — Volpe Koenig

(57) ABSTRACT

Communication devices, systems and methods for performing multi-layer packet coding (MLPC) in a wireless system are provided. The MLPC includes segmenting a data stream into a plurality of data segments, encoding each of the plurality of data segments into a plurality of forward error correction (FEC) codewords, performing a first exclusive OR (XOR) operation on the plurality of FEC codewords to generate a plurality of first layer parity codewords, performing a second XOR operation on the plurality of first layer parity codewords to generate at least one second layer parity
(Continued)

codeword, and transmitting at least one of: the plurality of FEC codewords, the plurality of first layer parity codewords, or the at least one second layer parity codeword.

15 Claims, 12 Drawing Sheets

Related U.S. Application Data filed on Sep. 28, 2016, provisional application No. 62/416,303, filed on Nov. 2, 2016.

(51) Int. Cl.
  *H03M 13/37* (2006.01)
  *H03M 13/00* (2006.01)
  *H04L 1/16* (2006.01)
  *H04L 1/18* (2006.01)
  *H04L 1/00* (2006.01)
  *H04L 5/00* (2006.01)

(52) U.S. Cl.
  CPC ..... *H03M 13/373* (2013.01); *H03M 13/6306* (2013.01); *H04L 1/00* (2013.01); *H04L 1/0063* (2013.01); *H04L 1/1671* (2013.01); *H04L 1/1819* (2013.01); *H04L 1/1845* (2013.01); *H04L 5/0055* (2013.01)

(58) Field of Classification Search
  CPC ............ H04L 1/1845; H03M 13/2906; H03M 13/098; H03M 13/2942; H03M 13/373; H03M 13/6306
  See application file for complete search history.

(56) References Cited

U.S. PATENT DOCUMENTS

| | | | |
|---|---|---|---|
| 8,419,547 B1* | 4/2013 | Radek ............... | H03M 13/2942 370/389 |
| 8,856,610 B2 | 10/2014 | Tada et al. | |
| 9,021,336 B1 | 4/2015 | Northcott | |
| 2005/0160350 A1 | 7/2005 | Dror et al. | |
| 2005/0257106 A1 | 11/2005 | Luby et al. | |
| 2007/0043997 A1 | 2/2007 | Yang et al. | |
| 2011/0283156 A1* | 11/2011 | Hiie ...................... | H04L 1/0042 714/746 |
| 2012/0131407 A1 | 5/2012 | Chiao et al. | |
| 2014/0181611 A1 | 6/2014 | Currivan et al. | |
| 2014/0250344 A1 | 9/2014 | Hellge et al. | |
| 2014/0281797 A1 | 9/2014 | Kharkunou | |
| 2015/0256204 A1* | 9/2015 | Torii ................. | H03M 13/2945 714/755 |
| 2016/0365947 A1 | 12/2016 | Roberts et al. | |
| 2018/0074891 A1* | 3/2018 | Yang ..................... | H03M 13/13 |

FOREIGN PATENT DOCUMENTS

| | | |
|---|---|---|
| JP | 2004349891 A | 12/2004 |
| JP | 2005323171 A | 11/2005 |
| JP | 2007243439 A | 9/2007 |
| JP | 2007243440 A | 9/2007 |
| JP | 2011091677 A | 5/2011 |
| JP | 2012161006 A | 8/2012 |

OTHER PUBLICATIONS

Ericsson, "Implementation Consideration of Channel Coding Options for NR," 3GPP TSG RAN WG1 Meeting #86bis, R1-1608879, Lisbon, Portugal (Oct. 10-14, 2016).
Gomez-Barquero et al., "Forward Error Correction for File Delivery in DVB-H," IEEE 65th Vehicular Technology Conference—VTC2007—Spring (Apr. 22-25, 2007).
Hellge et al., Layer-Aware Forward Error Correction for Mobile Broadcast of Layered Media, IEEE Transactions on Multimedia, 13(3):551-562. doi:10.1109/TMM.2011.2129499 (2011).
Interdigital Communications, "On Channel Codes for eMBB Data Channel with Small Block Sizes," 3GPP TSG RAN WG1 Meeting #87, R1-1612653, Reno, USA (Nov. 14-18, 2016).
Interdigital Communications, "Outer erasure code for efficient multiplexing," 3GPP TSG-RAN WG1 #85, R1-164667, Nanjing, China (May 23-27, 2016).
Interdigital Communications, "Performance Evaluation of Channel Codes for eMBB Control Channel," 3GPP TSG RAN WG1 Meeting #87, R1-1612655, Reno, USA (Nov. 14-18, 2016).
Interdigital Communications, "Performance Evaluation of Channel Codes for eMBB Control Channel," 3GPP TSG RAN WG1 Meeting #86bis, R1-1609896, Lisbon, Portugal (Oct. 10-14, 2016).
International Telecommunciation Union, "IMT Vision—Framework and overall objectives of the future development of IMT for 2020 and beyond; M Series Mobile, radiodetermination, amateur and related satellite services," Recommendation ITU-R M.2083-0 (Sep. 2015).
Janvars et al., "On Decoding of Multidimensional Single Parity Turbo Product Codes," Proceedings of the Joint 1st Workshop on Mobile Future and Symposium on Trends in Communications, pp. 25-28 (Oct. 2003).
LG Electronics, "Channel coding selection of eMBB scenario," 3GPP TSG RAN WG1 Meeting #86bis, R1-1609243, Lisbon, Portugal (Oct. 10-14, 2016).
MCC Support, "Final Report of 3GPP TSG RAN WG1 #84bis v1.0.0," 3GPP TSG RAN WG1 Meeting #85, R1-163961, Nanjing, China (May 23-27, 2016).
NEC, "On the channel coding scheme for NR," 3GPP TSG-RAN WG1 Meeting #86Bis, R1-1609389, Lisbon, Portugal (Oct. 10-14, 2016).
Qualcomm Incorporated, "Erasure coding and HARQ design," 3GPP TSG-RAN WG1 #86, R1-166374, Gothenburg, Sweden (Aug. 22-26, 2016).
Qualcomm Incorporated, "Erasure coding and HARQ design," 3GPP TSG-RAN WG1 #86bis, R1-1610143, Lisbon, Portugal (Oct. 10-14, 2016).
Qualcomm Incorporated, "Erasure coding evaluation methodology," 3GPP TSG-RAN WG1 #86, R1-166375, Gothenburg, Sweden (Aug. 22-26, 2016).
Qualcomm Incorporated, "Outer erasure code use cases and evaluation assumptions," 3GPP TSG RAN WG1 #85, R1-164703, Nanjing, China (May 23-27, 2016).
Roman et al., "Hybrid ARQ Schemes for Future Wireless Systems Based on MC-CDMA," available at https://pdfs.semanticscholar.org/83ec/06989de42f77fd60ea33f7bef82409892b73.pdf (2005).
Samsung et al., "WF on CB or CB-group based retransmission," 3GPP TSG RAN1#88, R1-17xxxxx (R1-1703740), Athens, Greece (Feb. 13-17, 2007).
Schierl et al., "Layer—Aware Forward Error Correction for Mobile Broadcast of Layered Media (L-FEC)," Fraunhofer Heinrich Hertz Institute available at https://www.hhi.fraunhofer.de/en/departments/vca/research-groups/multimedia-communications/research-topics/further-topics/layer-aware-forward-error-correction-l-fec.html.
Sharp et al., "Channel coding schemes for eMBB and URLLC Coexistence," 3GPP TSG RAN WG1 Meeting #86, R1-167913, Gothenburg, Sweden (Aug. 22-26, 2016).
Xu et al., "Physical Layer Packet Coding: Inter-Block Cooperative Coding for 5G," IEEE 83rd Vehicular Technology Conference (VTC Spring), (May 15-18, 2016).
Zte Corporation et al., "Consideration on Outer Code for NR," 3GPP TSG RAN WG1 #86, R1-166416, Gothenburg, Sweden (Aug. 22-26, 2016).
Zte Corporation et al., "Consideration on Outer Code for NR," 3GPP TSG RAN WG1 #85, R1-164280, Nanjing, China (May 23-27, 2016).
Zte et al., "Consideration on Outer Codes for NR," 3GPP TSG RAN WG1 #87, R1-1611115, Reno, USA (Nov. 14-18, 2016).
Zte et al., "Consideration on Outer Codes for NR," 3GPP TSG RAN WG1 #86bis, R1-1608976, Lisbon, Portugal (Oct. 10-14, 2016).

(56) References Cited

OTHER PUBLICATIONS

Zte et al., "Way Forward on Bursty URLLC impact handling," 3GPP TSG-RAN WG1 #86, R1-168120, Gothenburg, Sweden (Aug. 22-26, 2016).
Zte et al., "Way Forward on Bursty URLLC impact handling" 3GPP TSG RAN WG1 #85 meeting, R1-165954, Nanjing, China (May 23-27, 2016).
Zte, "Discussion on channel coding for new radio interface," 3GPP TSG RAN WG1 #84bis, R1-162230, Busan, Korea (Apr. 11-15, 2016).

* cited by examiner

METHOD AND SYSTEM FOR ADVANCED OUTER CODING

CROSS REFERENCE TO RELATED APPLICATIONS

This application is the U.S. National Stage, under 35 U.S.C. § 371, of International Application No. PCT/US2017/031727 filed May 9, 2017, which claims the benefit of U.S. Provisional Application No. 62/334,762 which was filed on May 11, 2016, U.S. Provisional Application No. 62/400,721 which was filed on Sep. 28, 2016 and U.S. Provisional Application No. 62/416,303 which was filed on Nov. 2, 2016, the contents of which is hereby incorporated by reference herein.

BACKGROUND

The throughput of wireless communication systems has increased with the use of the new technologies introduced in LTE and Wi-Fi. These technologies, however, are not sufficient to meet the demands of future applications which will have multiple requirements. For example, future applications may demand any one or a combination of the following: high throughput in a few Gbits/sec, low latency in less than 1 ms, and high reliability in less than $10^{-5}$ packet error rate (PER).

Research on a new radio access technology, known as 5G, has started. As the applications and ubiquity of cellular communication systems grow, the applications and cellular communication systems are expected to support new features, and meet a more stringent set of performance requirements.

SUMMARY

Communication devices, systems and methods for performing multi-layer packet coding (MLPC) in a wireless system are provided.

In an example, the MLPC includes segmenting a data stream into a plurality of data segments, encoding each of the plurality of data segments into a plurality of forward error correction (FEC) codewords, performing a first exclusive OR (XOR) operation on the plurality of FEC codewords to generate a plurality of first layer parity codewords, performing a second XOR operation on the plurality of first layer parity codewords to generate at least one second layer parity codeword, and transmitting at least one of: the plurality of FEC codewords, the plurality of first layer parity codewords, or the at least one second layer parity codeword.

In another example, the MLPC includes segmenting data in a transport block into a plurality of data segments over a plurality of sections, encoding each of the plurality of data segments into a plurality of forward error correction (FEC) codewords, transmitting FEC codewords of the plurality of FEC codewords for each of the plurality of sections of the transport block, receiving a plurality of feedback bits, each feedback bit indicating an acknowledgement (ACK) or a negative acknowledgement (NACK) for a different one of the a plurality of sections of the transport block. A feedback bit indicates the NACK in response to at least one failed FEC codeword of the transmitted FEC codewords in a corresponding section of the transport block, and the feedback bit indicates the ACK in response to successful transmission of all transmitted FEC codewords in the corresponding section of the transport block. The MLPC may further include retransmitting all the FEC codewords in the corresponding section responsive to the NACK.

BRIEF DESCRIPTION OF THE DRAWINGS

A more detailed understanding may be had from the following description, given by way of example in conjunction with the accompanying drawings wherein.

DETAILED DESCRIPTION

Figure 1A:
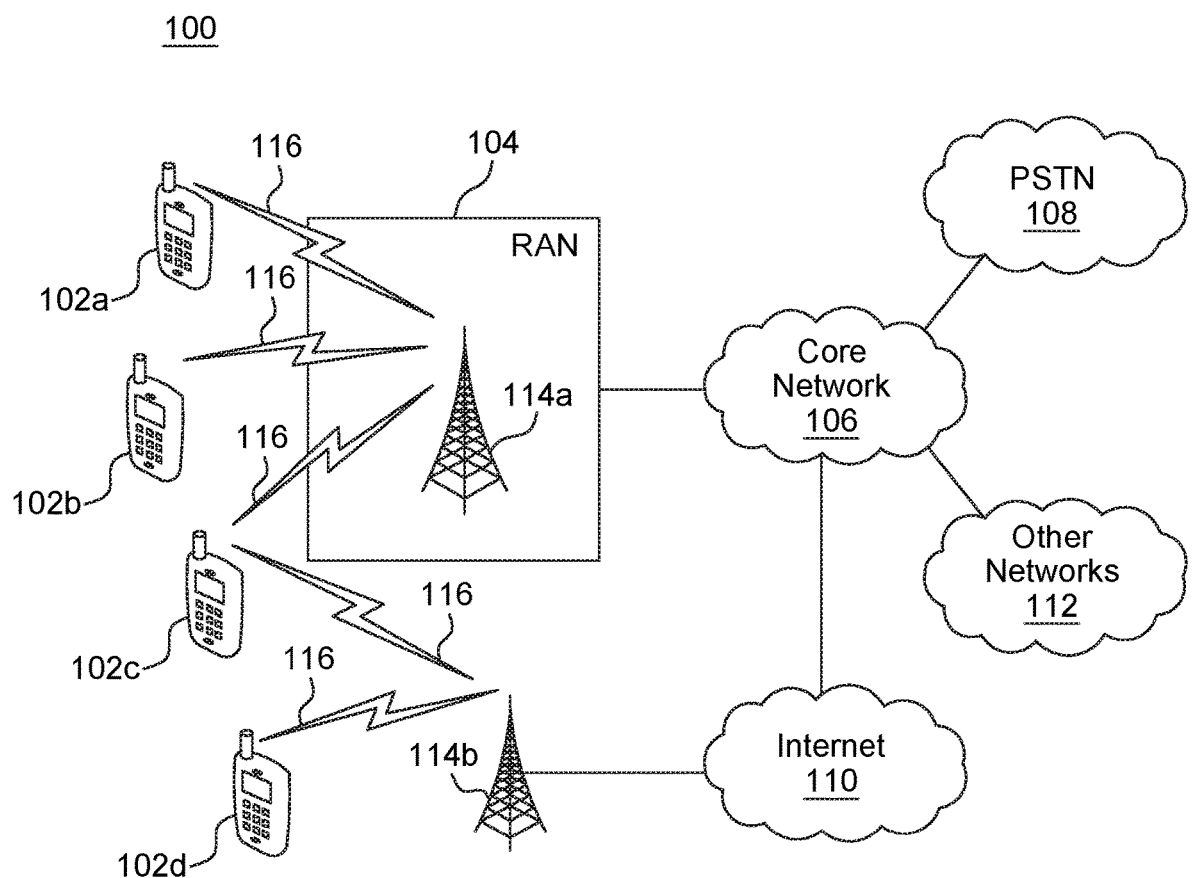
FIG. 1A is a system diagram of an example communications system in which one or more disclosed embodiments may be implemented.

Based on the general requirements set out by standard committees, a broad classification of the use cases for emerging New Rado (NR) or fifth-generation (5G) systems may be depicted as follows: Enhanced Mobile Broadband (eMBB), Massive Machine Type Communications (mMTC), and Ultra Reliable and Low latency Communications (URLLC).

Different use cases may focus on different requirements such as higher data rate, higher spectrum efficiency, low power and higher energy efficiency, lower latency and higher reliability.

mMTC is one of the three use case categories for the 5G cellular standards. The mMTC use case is characterized by the desire to provide connectivity for a very large number of low cost devices. For example, target applications may include smart metering, home appliances, and remote sensors. Common to all of these applications is that the data transmissions are relatively small and infrequent. One of the requirements to make these massive deployments feasible will be the ability to use low cost devices with significantly extended battery life.

The following channel coding schemes may also be used in NR or 5G systems: low-density parity-check (LDPC) code, polar code, turbo code (LTE and/or enhanced turbo coding), or convolutional code (LTE and/or enhanced convolutional coding). The combination of these codes, as well as outer erasure codes, may also be used.

With various requirements on channel coding design, new Radio Access Technology (RAT) channel coding schemes consider: performance, implementation complexity, latency (decoding/encoding), and flexibility (e.g., variable code length, code rate, and hybrid automatic repeat request (HARQ) for particular scenarios).

For example, consider a transmitter tasked to transmit time-sensitive data to a receiver over a very noisy channel, and the segmentations of the data are encoded by an inner channel code. Due to the noisy channel, some data segmentations may not be successfully decoded even though HARQ retransmissions are applied. The missing data segments may be covered only through some ARQ processes at a higher layer (e.g., radio link control (RLC) layer). This cross-layer recovery could be time-consuming, and may be against the data latency requirements. Hence, a packet coding scheme may be used to reduce the transmission latency and improve the overall physical layer decoding performance.

However, only a single parity codewords are generated in the current packet coding schemes. Thus, current packet coding schemes do not provide good error-detection capability if the number of data segments is large. Furthermore, the error protection of the transmission of a parity codeword is not guaranteed. Finally, the current packet coding scheme has low flexibility, in terms of its HARQ operations. Hence, it may be desirable to design advanced packet coding schemes to solve the above problems.

There may also be a problem signaling on the channel coding selection for NR. In existing LTE communication systems, the coding schemes for data channels in the uplink (UL) and downlink (DL) are kept the same. For example, the turbo codes are used in both the Downlink Shared Channel (DL-SCH) and the Uplink Shared Channel (UL-SCH), while LDPC codes are used in both directions in WiFi systems.

Due to various application scenarios, NR systems may need to take into account device hardware restrictions and mixed traffics for different use cases. For instance, an eNode-B (eNB) could have very strong computational power while an mMTC device may have limited computational power. On the other hand, the computational complexity of channel decoding is generally much more than channel encoding. Hence, the usage of the same channel coding schemes for both DL and UL may not be efficient.

FIG. 1A is a diagram of an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), and the like.

As shown in FIG. 1A, the communications system 100 may include wireless transmit/receive units (WTRUs) 102a, 102b, 102c, 102d, a radio access network (RAN) 104, a core network 106, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d may be configured to transmit and/or receive wireless signals and may include user equipment (UE), a mobile station, a fixed or mobile subscriber unit, a pager, a cellular telephone, a personal digital assistant (PDA), a smartphone, a laptop, a netbook, a personal computer, a wireless sensor, consumer electronics, and the like.

The communications systems 100 may also include a base station 114a and a base station 114b. Each of the base stations 114a, 114b may be any type of device configured to wirelessly interface with at least one of the WTRUs 102a, 102b, 102c, 102d to facilitate access to one or more communication networks, such as the core network 106, the Internet 110, and/or the other networks 112. By way of example, the base stations 114a, 114b may be a base transceiver station (BTS), a Node-B, an eNode B, a Home Node B, a Home eNode B, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104, which may also include other base stations and/or network elements (not shown), such as a base station controller (BSC), a radio network controller (RNC), relay nodes, etc. The base station 114a and/or the base station 114b may be configured to transmit and/or receive wireless signals within a particular geographic region, which may be referred to as a cell (not shown). The cell may further be divided into cell sectors. For example, the cell associated with the base station 114a may be divided into three sectors. Thus, in one embodiment, the base station 114a may include three transceivers, i.e., one for each sector of the cell. In another embodiment, the base station 114a may employ multiple-input multiple-output (MIMO) technology and, therefore, may utilize multiple transceivers for each sector of the cell.

The base stations 114a, 114b may communicate with one or more of the WTRUs 102a, 102b, 102c, 102d over an air interface 116, which may be any suitable wireless communication link (e.g., radio frequency (RF), microwave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104 and the WTRUs 102a, 102b, 102c may implement a radio technology such as Universal Mobile Telecommunications System (UMTS) Terrestrial Radio Access (UTRA), which may establish the air interface 116 using wideband CDMA (WCDMA). WCDMA may include communication protocols such as High-Speed Packet Access (HSPA) and/or Evolved HSPA (HSPA+). HSPA may include High-Speed Downlink Packet Access (HSDPA) and/or High-Speed Uplink Packet Access (HSUPA).

In another embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A).

In other embodiments, the base station 114a and the WTRUs 102a, 102b, 102c may implement radio technologies such as IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, and the like. In one embodiment, the base station 114b and the WTRUs 102c, 102d may implement a radio technology such as IEEE 802.11 to establish a wireless local area network (WLAN). In another embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, etc.) to establish a picocell or femtocell. As shown in FIG. 1A, the base station 114b may have a direct connection to the Internet 110. Thus, the base station 114b may not be required to access the Internet 110 via the core network 106.

The RAN 104 may be in communication with the core network 106, which may be any type of network configured to provide voice, data, applications, and/or voice over internet protocol (VoIP) services to one or more of the WTRUs 102a, 102b, 102c, 102d. For example, the core network 106 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104 and/or the core network 106 may be in direct or indirect communication with other RANs that employ the same RAT as the RAN 104 or a different RAT. For example, in addition to being connected to the RAN 104, which may be utilizing an E-UTRA radio technology, the core network 106 may also be in communication with another RAN (not shown) employing a GSM radio technology.

The core network 106 may also serve as a gateway for the WTRUs 102a, 102b, 102c, 102d to access the PSTN 108, the Internet 110, and/or other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and the internet protocol (IP) in the TCP/IP internet protocol suite. The networks 112 may include wired or wireless communications networks owned and/or operated by other service providers. For example, the networks 112 may include another core network connected to one or more RANs, which may employ the same RAT as the RAN 104 or a different RAT.

Some or all of the WTRUs 102a, 102b, 102c, 102d in the communications system 100 may include multi-mode capabilities, i.e., the WTRUs 102a, 102b, 102c, 102d may include multiple transceivers for communicating with different wireless networks over different wireless links. For example, the WTRU 102c shown in FIG. 1A may be configured to communicate with the base station 114a, which may employ a cellular-based radio technology, and with the base station 114b, which may employ an IEEE 802 radio technology.

Figure 1B:
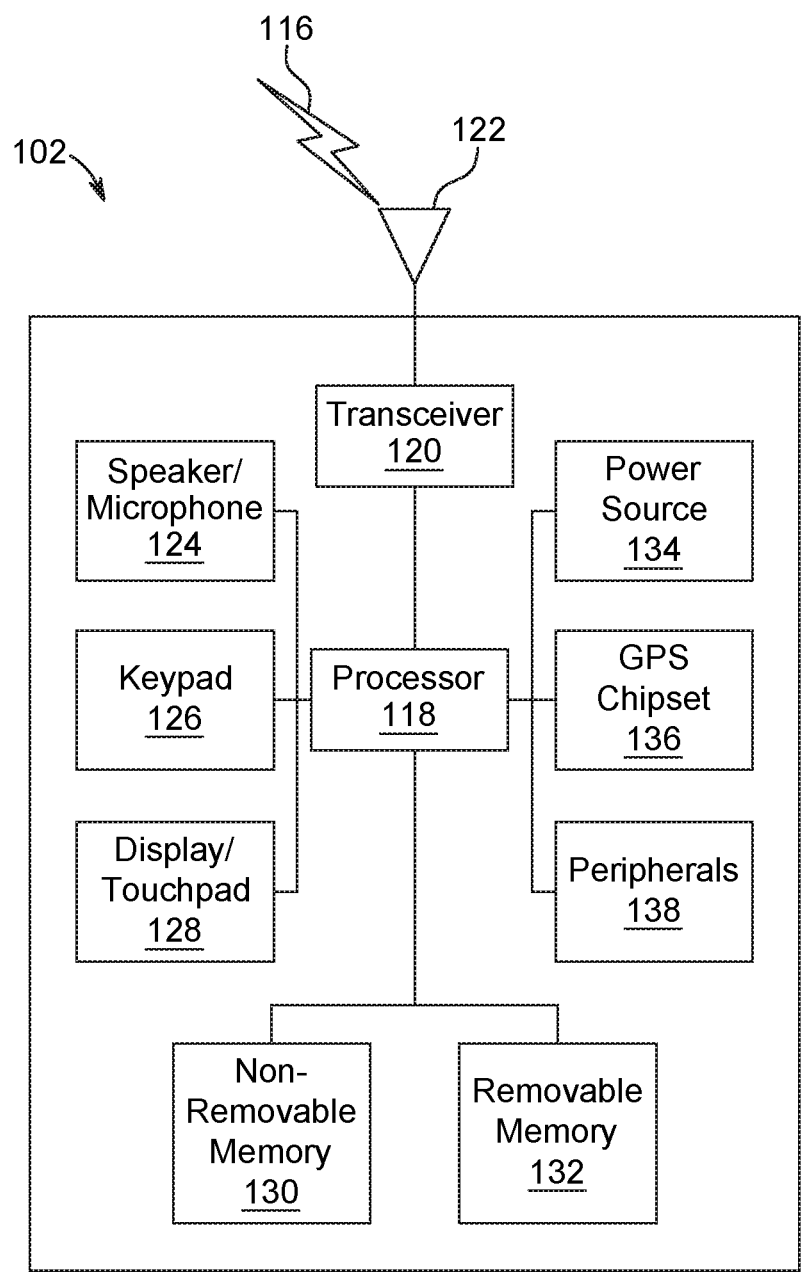
FIG. 1B is a system diagram of an example wireless transmit/receive unit (WTRU) that may be used within the communications system illustrated in FIG. 1A.

FIG. 1B is a system diagram of an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and other peripherals 138. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Array (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In another embodiment, the transmit/receive element 122 may be an emitter/detector configured to transmit and/or receive IR, UV, or visible light signals, for example. In yet another embodiment, the transmit/receive element 122 may be configured to transmit and receive both RF and light signals. It will be appreciated that the transmit/receive element 122 may be configured to transmit and/or receive any combination of wireless signals.

In addition, although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as UTRA and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs or video), a universal serial bus (USB) port, a vibration device, a television transceiver, a hands free headset, a Bluetooth® module, a frequency modulated (FM) radio unit, a digital music player, a media player, a video game player module, an Internet browser, and the like.

Figure 1C:
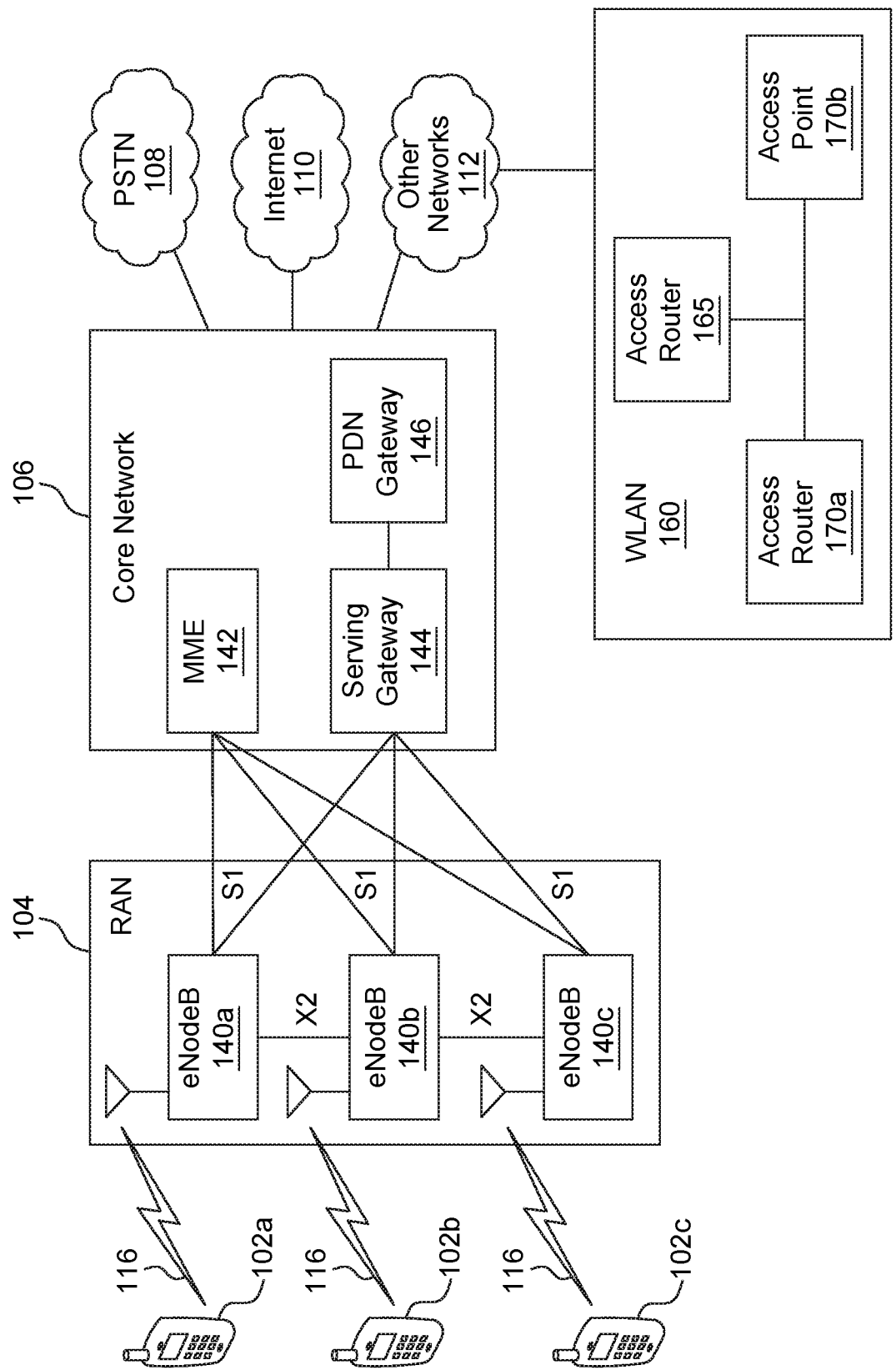
FIG. 1C is a system diagram of an example radio access network and an example core network that may be used within the communications system illustrated in FIG. 1A.

FIG. 1C is a system diagram of the RAN 104 and the core network 106 according to an embodiment. As noted above, the RAN 104 may employ an E-UTRA radio technology to communicate with the WTRUs 102a, 102b, 102c over the air interface 116. The RAN 104 may also be in communication with the core network 106.

The RAN 104 may include eNode-Bs 140a, 140b, 140c, though it will be appreciated that the RAN 104 may include any number of eNode-Bs while remaining consistent with an embodiment. The eNode-Bs 140a, 140b, 140c may each include one or more transceivers for communicating with the WTRUs 102a, 102b, 102c over the air interface 116. In one embodiment, the eNode-Bs 140a, 140b, 140c may implement MIMO technology. Thus, the eNode-B 140a, for example, may use multiple antennas to transmit wireless signals to, and receive wireless signals from, the WTRU 102a.

Each of the eNode-Bs 140a, 140b, 140c may be associated with a particular cell (not shown) and may be configured to handle radio resource management decisions, handover decisions, scheduling of users in the uplink and/or downlink, and the like. As shown in FIG. 1C, the eNode-Bs 140a, 140b, 140c may communicate with one another over an X2 interface.

The core network 106 shown in FIG. 1C may include a mobility management entity gateway (MME) 142, a serving gateway 144, and a packet data network (PDN) gateway 146. While each of the foregoing elements are depicted as part of the core network 106, it will be appreciated that any one of these elements may be owned and/or operated by an entity other than the core network operator.

The MME 142 may be connected to each of the eNode-Bs 140a, 140b, 140c in the RAN 104 via an S1 interface and may serve as a control node. For example, the MME 142 may be responsible for authenticating users of the WTRUs 102a, 102b, 102c, bearer activation/deactivation, selecting a particular serving gateway during an initial attach of the WTRUs 102a, 102b, 102c, and the like. The MME 142 may also provide a control plane function for switching between the RAN 104 and other RANs (not shown) that employ other radio technologies, such as GSM or WCDMA.

The serving gateway 144 may be connected to each of the eNode Bs 140a, 140b, 140c in the RAN 104 via the S1 interface. The serving gateway 144 may generally route and forward user data packets to/from the WTRUs 102a, 102b, 102c. The serving gateway 144 may also perform other functions, such as anchoring user planes during inter-eNode B handovers, triggering paging when downlink data is available for the WTRUs 102a, 102b, 102c, managing and storing contexts of the WTRUs 102a, 102b, 102c, and the like.

The serving gateway 144 may also be connected to the PDN gateway 146, which may provide the WTRUs 102a, 102b, 102c with access to packet-switched networks, such as the Internet 110, to facilitate communications between the WTRUs 102a, 102b, 102c and IP-enabled devices.

The core network 106 may facilitate communications with other networks. For example, the core network 106 may provide the WTRUs 102a, 102b, 102c with access to circuit-switched networks, such as the PSTN 108, to facilitate communications between the WTRUs 102a, 102b, 102c and traditional land-line communications devices. For example, the core network 106 may include, or may communicate with, an IP gateway (e.g., an IP multimedia subsystem (IMS) server) that serves as an interface between the core network 106 and the PSTN 108. In addition, the core network 106 may provide the WTRUs 102a, 102b, 102c with access to the networks 112, which may include other wired or wireless networks that are owned and/or operated by other service providers.

Other network 112 may further be connected to an IEEE 802.11 based wireless local area network (WLAN) 160. The WLAN 160 may include an access router 165. The access router may contain gateway functionality. The access router 165 may be in communication with a plurality of access points (APs) 170a, 170b. The communication between access router 165 and APs 170a, 170b may be via wired Ethernet (IEEE 802.3 standards), or any type of wireless communication protocol. AP 170a is in wireless communication over an air interface with WTRU 102d.

Forward error correction (FEC) is a digital signal processing technique used to enhance data reliability. It does this by introducing redundant data, called error correcting code (e.g., error control bits), prior to data transmission or storage. For example, consider a message having four data bits which is to be transmitted as a 7-bit codeword by adding three error control bits. This would be called a (7, 4) code. That means that the total codeword length is seven bits, but only four of those bits are actually data.

Thus, FEC codewords are generated from the original message using an algorithm that introduces a certain amount of redundancy into the codeword; and, thus, the FEC codeword is longer than the original message. For example, an input message composed of K symbols may be input to a channel encoder that outputs an FEC codeword composed of N symbols, where N>K. Since N>K, there is redundancy in the output. This redundancy is distributed across the FEC codeword and allows the original message to be recovered with good probability even in the presence of errors. The more redundant the FEC codeword, the more resilient it is against errors, and the fewer queries required to recover a bit of the original message.

FEC provides the receiver with the ability to correct errors without a reverse channel to request the retransmission of data. Forward error coding is also known as channel coding.

Thus, channel coding is a technique commonly used in communication systems to improve the performance through the introduction of redundancy into the transmission. Various channel coding techniques have been developed and different techniques are used based on the specific application. Channel codes can be classified into block codes, where the redundancy is added to blocks of data, and convolutional codes, where the redundancy is added in a continuous fashion.

Concatenated coding attempts to combine the performance improvement of two or more FEC codes, physically layered as an inner and an outer code. For example, concatenated codes may be comprised of a stronger inner code and a weaker outer code, with an interleaver connecting the inner and outer codes together. Concatenation of codes can be serial, parallel, or multilevel code concatenation.

Figure 2:
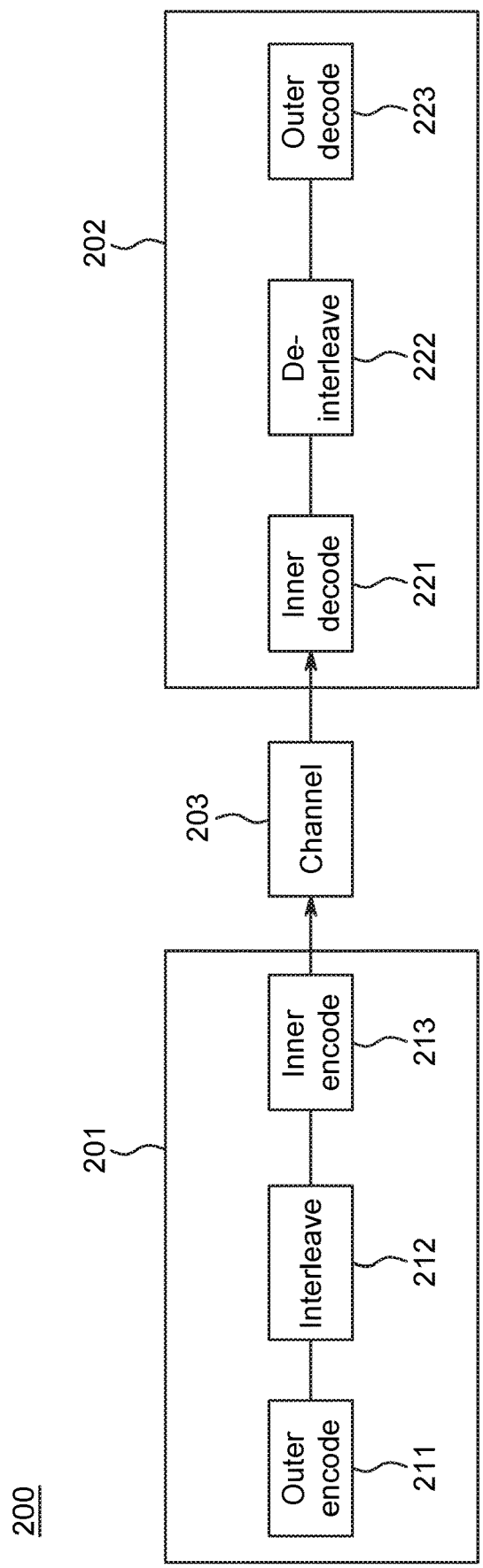
FIG. 2 is a block diagram of a communication system utilizing outer and inner coding by serial concatenation according to one or more embodiments.

FIG. 2 provides an illustration of a block diagram of a communication system 200 utilizing outer and inner coding by serial concatenation according to one or more embodiments. The communication system 200 includes a transmitter 201 and a receiver 202 that communicate over a channel 203. The transmitter 201 includes an outer encoder 211, an interleaver 212 and an inner encoder 213 for generating and transmitting the data packet. Similarly, the receiver 202 includes an inner decoder 221, a de-interleaver 222 and an outer decoder 223 for receiving and decoding the encoded packet.

The transmitter 201 may be either one of an eNode-B or a WTRU, for example, with a transceiver chipset for encoding data to be transmitted in a signal. Additionally, the receiver 202 may be either one of an eNode-B or a WTRU, for example, with a transceiver chipset for decoding data received in a signal. Thus, the transmitter 201 and the receiver 202 may refer to an entity, such as a communication device, that includes transmitter, receiver and/or transceiver components and one or more processors, and generally refers to the entity that is performing the transmitting or receiving in a transmission operation.

At the transmitter, the outer encoder 211 encodes the data with an outer code to generate an outer frame. The outer frame is then interleaved by the interleaver 212 to produce an intermediate frame. The intermediate frame is then encoded by the inner encoder 213, which encodes the intermediate frame with an inner code to generate a final frame. The data, once encoded, is transmitted across a channel 203 (i.e., a data path) and decoded at the receiver 202 in reverse order.

In particular, at the receiver 202, the inner coder 221 decodes the data at the receiver 202; then the outer coder 223 decodes the same data after it is de-interleaved by the de-interleaver 222. Employing such iterative decoding allows the outer decoder 223 to correct any remaining errors not corrected by the inner decoder 221.

The inner code may be any type of regular FEC codes. The outer code attempts to provide additional improvement of performance. The interleaver 212 rearranges the order of transmitted symbols, while the corresponding de-interleaver 222 at the receiver side restores the original order. De-interleaving may disperse a burst of errors associated with an inner-decoder error event so that these individual errors may be more easily corrected by the outer code's decoder. Thus, de-interleaving allows the inner channel-code output to appear independent from symbol to symbol.

Serial concatenation with interleaving traditionally uses an inner code that makes hard decisions on its inner-code decoder output. Such hard decisions allow the inner code-and-channel to be modeled by a binary symmetric channel (BSC) or, more generally, discrete memoryless channel (DMC). The outer code is designed to reduce probability of errors to negligible levels. Such low error probabilities essentially mean that the transmission layer is effectively error-free, a highly desirable result in many applications. This form of serial concatenation allows one of the basic results to be achieved (e.g., arbitrarily reliable transmission).

According to one or more embodiments, packet coding may be used to reduce the decoding complexity and decrease the latency. It may be used in the physical layer to allow simple XOR relationship established among independent FEC codewords to enhance the packet error rate (PER) performance. In packet coding, a single parity codeword is used for all FEC codewords via XOR operations. For example, suppose a long transport block is partitioned into several segments $P_1, \ldots, P_{n_1}$. Each segment $P_1, \ldots, P_{n_1}$ is encoded by a FEC channel code to generate an FEC codeword. A parity codeword is generated by applying an XOR operation to the FEC codewords resulting from all the segments $P_1, \ldots, P_{n_1}$. By using packing coding, the transmission efficiency and decoding performance may be increased.

Multi-Layer Packet Coding (MLPC) may be introduced to provide reliable communication with low latency and low complexity. For example, FIG. 3 shows a diagram of an example multi-layer packet coding (MLPC) construction architecture according to one or more embodiments.

Figure 3:
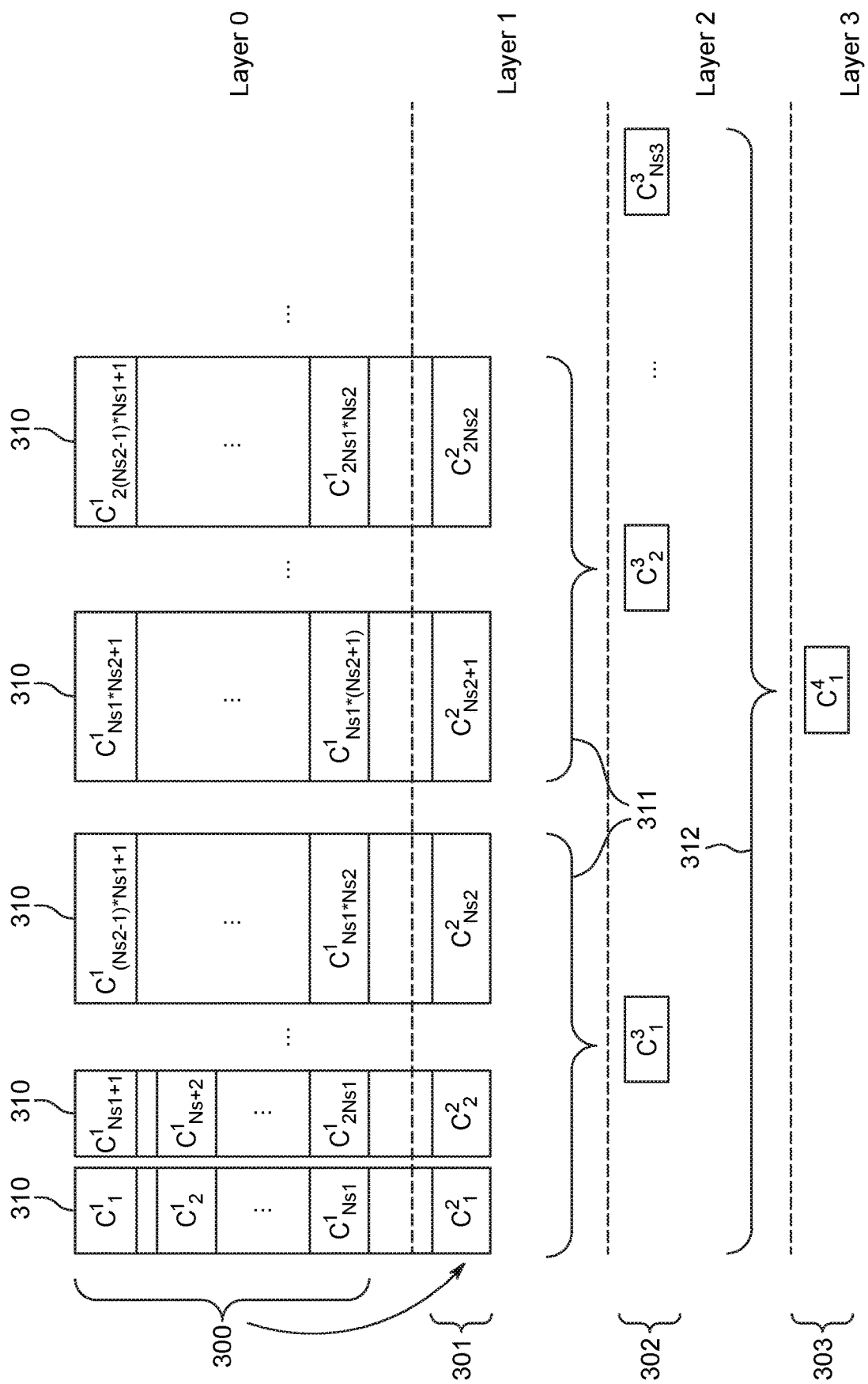
FIG. 3 shows a diagram of an example multi-layer packet coding (MLPC) construction architecture according to one or more embodiments.

FIG. 3 illustrates k-layers of generated FEC and parity codewords. Here, $C_i^{k+1}$ denotes the i-th codeword at the k-th layer of one or more packet coding layers. In the example illustrated in FIG. 3, there are three packet coding layers (i.e., layers 1-3), referred to as the first, second and third layers, respectively, where k=3. The zero-th layer is not counted in the total number of packet coding layers. In addition, the codewords for the zero-th layer $C_i^1$ are FEC codewords 300 which are generated from original data segments $P_1, \ldots, P_{n_1}$ or code blocks (CBs). The codewords 301, 302 and 303 for a higher layer $C_i^k$, k>0 (e.g., layers 1-3) are parity codewords 301, 302 and 303 which are generated by XOR operation.

Thus, provided the initial data can be partitioned to multiple segments $P_1, \ldots, P_{n_1}$, each segment is separately processed by the inner FEC channel encoder (e.g., inner encoder 213). Hereinafter, "segment" and "code block" may be used interchangeably. The outputs $C_i^1$, $1 \leq i \leq n_1$ of the inner FEC channel encoder are the FEC codewords 300, wherein $n_1$ is the number of FEC codewords 300. By MLPC, every $N_{s_1}$ FEC codewords compose a different zero-th layer section 310. The XOR of the FEC codewords 300 in every section 310 is calculated. This results in a number $n_2$ of $C_i^2$ parity codewords 301 at layer 1, where $1 \leq i \leq n_2$ and $$n_2 = \left\lceil \frac{n_1}{N_{s_1}} \right\rceil.$$

Next, every number of $N_{s_2}$ parity codewords 301 (i.e., parity codewords $C_i^2$) are grouped to compose of a different first layer section 311. The XOR of the parity codewords 301 in each section 311 is calculated to generate second layer parity codewords 302. This results in a number $n_3$ of $C_i^3$ parity codewords 302, where $1 \leq i \leq n_3$ and $$n3 = \left\lceil \frac{n_2}{N_{s_2}} \right\rceil.$$

For example, one of the first layer sections 311 may be composed of consecutive or adjacent parity codewords $$C_1^2 \ldots C_{N_{s_2}}^2$$

from which a second layer parity codeword 302 is generated therefrom by an XOR operation.

Then, every $N_{s_3}$ packet codewords 302 (i.e., parity codewords $C_i^3$) are grouped to compose of a different second layer section 312. Here, only one second layer section 312 is formed. The XOR of the parity codewords 302 in each section 312 is calculated to generate third layer parity codewords 303. This results in a number $n_4$ of $C_i^4$ parity codewords 303, where $1 \leq i \leq n_4$ and $$n4 = \left\lceil \frac{n_3}{N_{s_3}} \right\rceil.$$

This process is continued on a layer-by-layer basis until $n_{K+1}=1$, where K represents the k-th layer of one or more packet coding layers.

As demonstrated above, multiple layers of packet coding processes are applied. As demonstrated above, multiple layers of packet coding processes are applied. In FIG. 3, the number of layers is equal to 3. If the number of layers is equal to 1, then only parity codewords 301 at the first layer are generated. The packet coding process at a layer higher than layer 1 is similar to treating parity codewords as FEC codewords at layer 1 to generate the next layer of parity codeword(s).

Thus, in a first layer operation, every $N_{s_1}$ FEC codewords 300 result in a parity codeword 301, $C_i^2$. In the k-th layer operation, $1 \leq k \leq N_l-1$, every $N_{s_k}$ parity codewords 301, 302, etc., from the (k-1)-th layer $C_i^k$, where:

$$1 \leq i \leq N_{s_k},$$

result in a next layer parity codeword $C^{k+1}$. In general, for $k=1, \ldots, N_l-1$, where $N_l$ is the number of layers:

$$C_i^{k+1} = C_{(i-1) \cdot N_{s_k}+1}^k \oplus C_{(i-1) \cdot N_{s_k}+2}^k \cdots \oplus C_{i \cdot N_{s_k}}^k.$$

The use of the multi-layer packet coding provides an additional protection on parity codewords at lower layers (e.g., at layer 1). The parity codewords from multiple layers, together with the FEC codewords, may be transmitted to the receiver by the transmitter. Optionally, the parity codewords may be transmitted standalone upon the retransmission request of MLPC HARQ process.

In will be appreciated that the number of elements, including number of data segments, sections, elements within a section, FEC codewords, parity codewords, layers, and the like, may vary and are wholly configurable based on system implementation in any combination, and are not limited to the example illustrated in FIG. 3.

Figure 4:
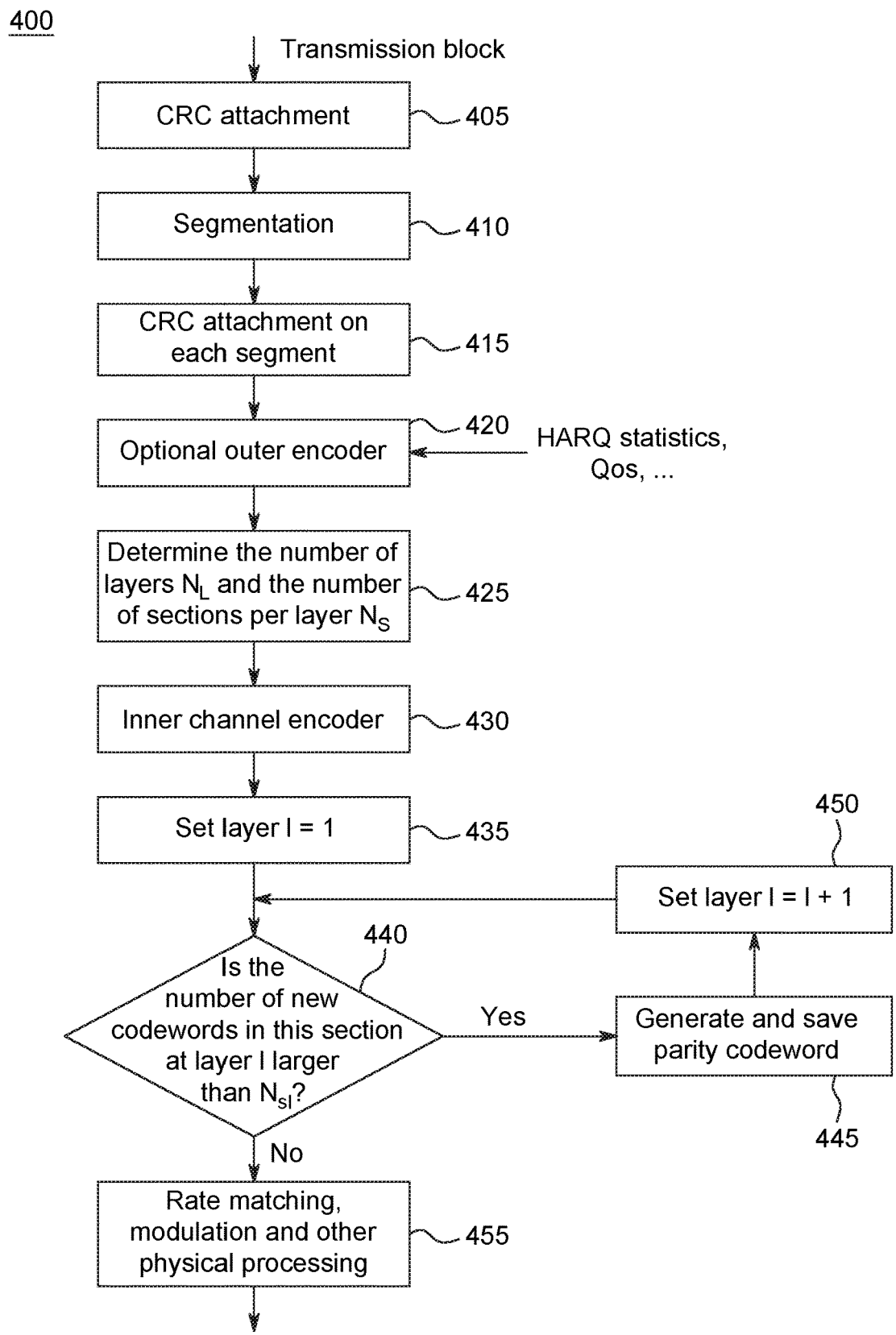
FIG. 4 shows a flow diagram illustrating a transmitter procedure for performing multiple-layer packet coding (MLPC) according to one or more embodiments.

FIG. 4 shows a flow diagram illustrating a transmitter procedure 400 for performing MLPC according to one or more embodiments.

In operation 405, the transmitter, including at least one processor, receives a transmission block from upper layer, and may generate a cyclic redundancy check (CRC) and attach the CRC to the transmission block.

In operation 410, the transmitter may execute segmentation of the transmission block so that each segment is configured to a size fitting to an inner FEC encoder.

In operation 415, the transmitter may further generate a CRC for each segment and attach the CRC to each segment.

In operation 420, the transmitter, each data segment with CRC is then passed through the block of an outer encoder. It is noted that the outer encoder is optional. The outer code may be a Reed-Solomon code, fountain codes (or rateless erasure code), such as raptor code, Bose-Chaudhuri-Hocquenghem (BCH) code, or any other type of code. The outer encoder may also be turned on and off, based on one or more various conditions. The one or more various conditions may be one or any combination of HARQ statistics or data quality of service (QoS).

The HARQ statistics may be obtained by observing the outputs of a "legacy (inner) channel decoder". If most of the "legacy (inner) channel decoder" outputs are correct, then the outer encoder may not be needed.

With respect to the data QoS, the outer encoding block may be turned off if the source data requires less error protection but requires low latency. Otherwise, the outer encoding block could be turned on.

Optionally, if the outer encoding block is enabled, an interleaver may be used between the outer encoder and the inner encoder.

In operation 425, the transmitter may determine, based on a total length of the source data and their QoS requirements, a total number of layers $N_1$ to apply to MLPC. Correspondingly, the transmitter may further determine the number of sections $N_s$ per layer.

For example, in a case including source date of 100 segments, there may be 2 layers and each layer is composed of 10 sections. For the zero-th layer, each section may be composed of multiple FEC codewords. For the first (or higher) layer, each section corresponds to a parity (XOR)

codeword of all component (i.e., previous layer) codewords. In general, a total number of segments N, the number of layers ($N_l$−1), and the number of codewords $N_{s_k}$ per section for (k−1)-th layer, satisfy:

$$N = \prod_{k=1}^{N_l-1} N_{s_k}.$$

In a simple case that $$N_{s_1} = N_{s_2} = \ldots = N_{s_{N_l-1}} = N_s$$

then $N = N_s^{N_l-1}$. It is noted that the generation of the sections or groups for the zero-th layer is equivalent before and after inner channel coding. For the zero-th layer, a section of data segments is actually a group of code blocks. Each code block in a section may or may not be attached with code block level CRC.

Figure 5:
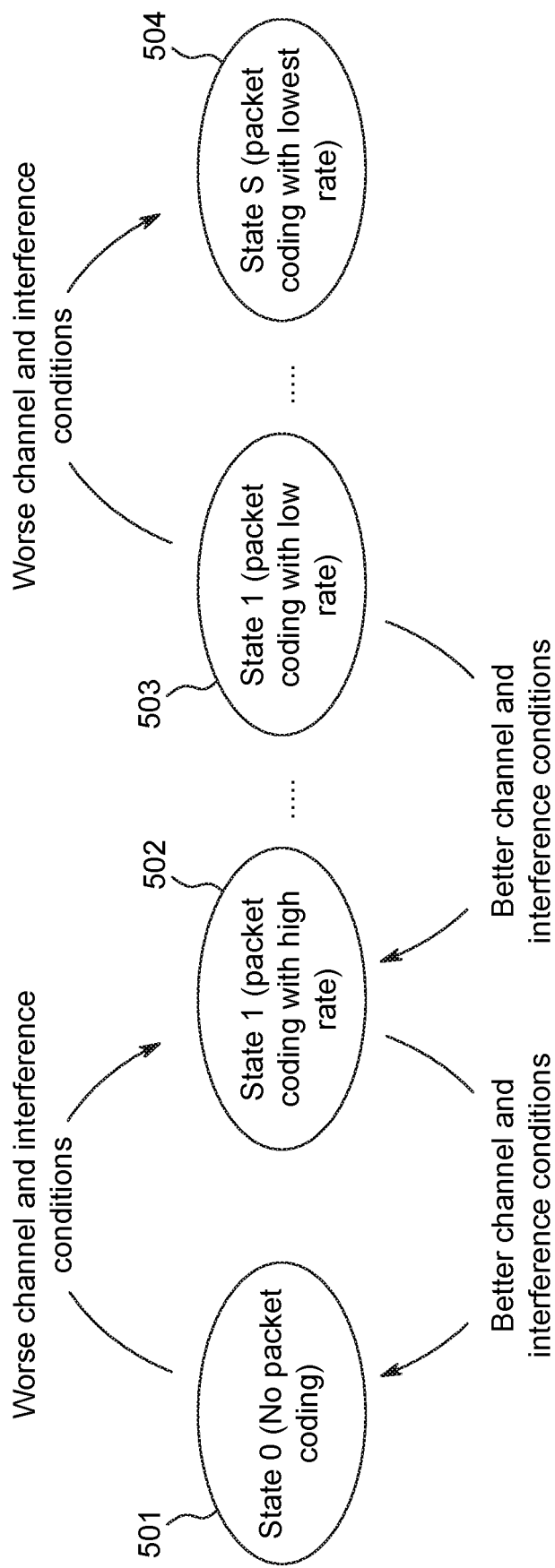
FIG. 5 illustrates a finite state machine for switching among different states corresponding to packet coding rates according to one or more embodiments.

FIG. 5 illustrates a finite state machine for switching among different states corresponding to packet coding rates according to one or more embodiments. Depending on the channel and interference conditions, there may be multiple packet coding states. In good channel and interference conditions, the transmitter may be in State 0 501, which does not apply packet coding at all. In a relatively bad channel and interference conditions, the transmitter may be in State 1 502 that employs high rate packet coding. In a still worse channel and interference conditions, the transmitter may be in some state 503 (e.g., State 1) that employs lower rate packet coding. In the worst channel and interference conditions, the transmitter may be in the last State S 504 which employs lowest rate packet coding. The switch among these states could follow Markov chain or may jump through certain rules, e.g., like the backoff window size in a binary exponential backoff algorithm. Each state may correspond to certain values of $N_{s1}$, where $1 \leq l \leq N_L$.

Returning to FIG. 4, in operation 430, the transmitter encodes each segment by an inner FEC encoder, e.g., Turbo, LDPC, polar codes or convolutional code (CC) which may be an LTE CC or any advanced CC. To provide early stop of decoding and error check, CRC may be attached to each segment before encoded by an inner FEC encoder such as turbo or polar codes. Optionally, CRC may not be attached as the parity-check criterion for some inner FEC encoders, such as LDPC, may be used for early stop of decoding and error check which may be used for HARQ acknowledgement generation. Thus, FEC codewords are generated.

In operation 435, the transmitter sets a counter value, layer 1, to 1.

In operation 440, the transmitter compares the value stored in the counter, layer 1 to $N_{sl}$ and proceeds to operation 445 if the counter value, layer 1, is greater than $N_{sl}$, and proceeds to operation 455 if the counter value, layer 1, is less than or equal to $N_{sl}$.

In operation 445, after encoding every $N_s$ segment into an FEC codeword, the transmitter calculates the parity (XOR) of these $N_s$ FEC codewords, which can be considered as a new encoded segment at the second layer (i.e., a parity codeword). Furthermore, at each higher layer iteration, after encoding every $N_{s_i}$ segments at layer i, the XOR of these $N_{s_i}$ segments is calculated, which can be considered as a new encoded segment at layer i+1. The transmitter stores the generated parity codewords, and, then, increments the counter value, layer 1, in operation 450.

In operation 455, the FEC codewords and/or parity codewords are transmitted by the transmitter to the receiver after executing rate matching, modulation and other physical process. The other physical process may include the resource mapping.

There are several options to map FEC codewords and parity codewords to different resource blocks (RBs) or physical resource block (PRB). One option is to map FEC codewords to more reliable RBs, i.e., the RBs with the least fading, while map parity codewords to less reliable RBs. Thus, the higher level parity codewords are mapped to less reliable RBs. For example, the transmitter may sort the RBs according to reliability, and apply the highest level or layer parity codewords to the least reliable RBs until the highest level of parity codewords are mapped, apply the next highest level of parity codewords to less liable RBs until this level of parity codewords are mapped, and so on until the lowest level of parity codewords are mapped to more reliable RBs or until the FEC codewords are mapped to more reliable (or the most reliable) RBs. This design may ensure less retransmission rate from the beginning or the lower layer.

Conversely, another option is to map FEC codewords to less reliable RBs, while map parity codewords to more reliable RBs. Thus, the higher level parity codewords are mapped to more reliable RBs. This design may ensure high error correction capabilities once some error occurs.

Other options with some mixed operations of the above mapping methods may be also possible. The reliability of RB or PRB may be indicated by channel state related measurements (such as channel state information (CSI), signal-to-interference-plus-noise ratio (SINR), or the like) corresponding to that PRB. Higher resolution CSI feedback than full-band CSI feedback may be provided to facilitate the resource allocation for MLPC, e.g., sub-band CSI feedback, or one or more RB based CSI feedback. Periodic or aperiodic CSI feedback may be used to facilitate the resource allocation for MLPC.

Figure 6:
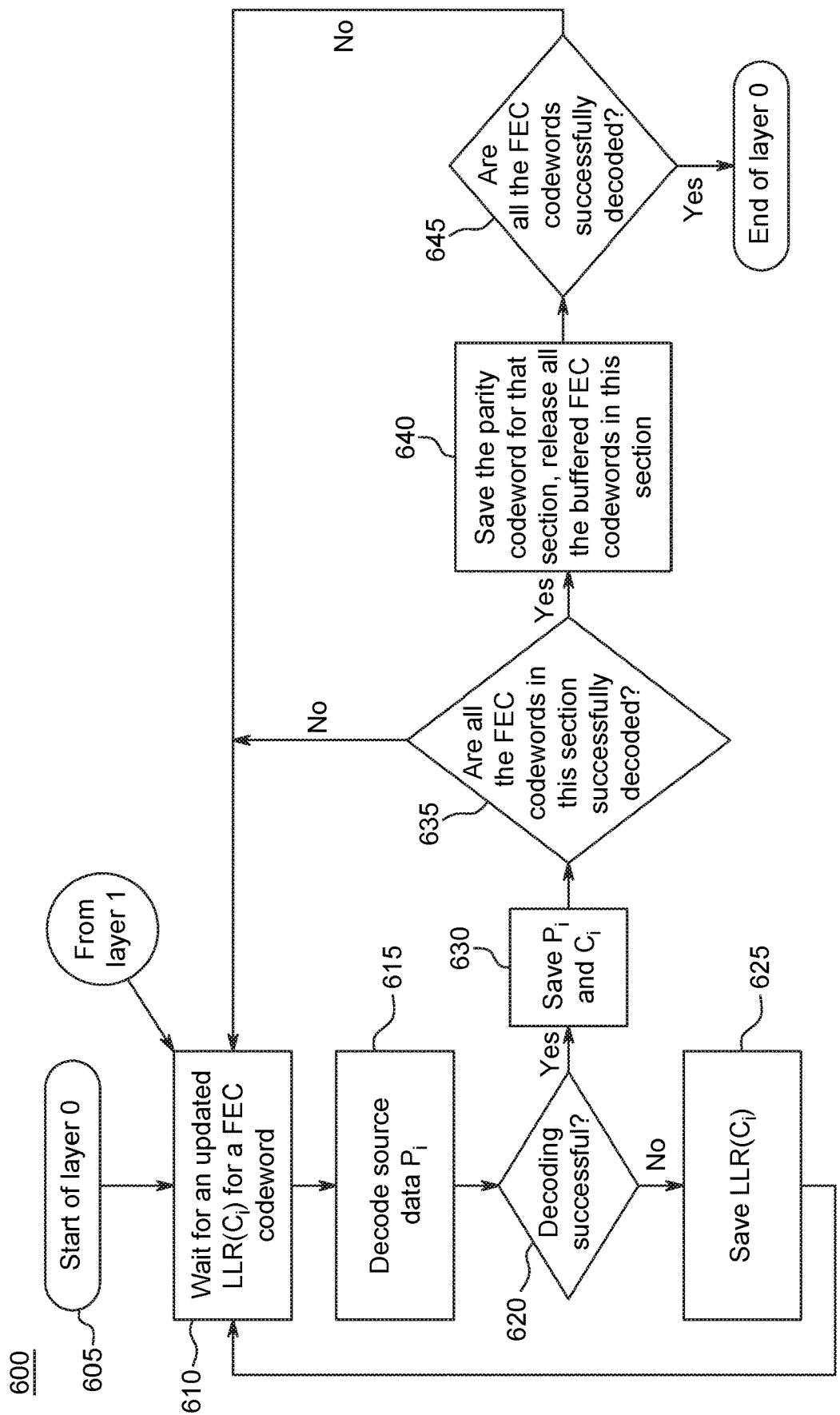
FIG. 6 shows a flow diagram of a decoding procedure for MLPC layer 0 codewords according to one or more embodiments.

At the receiver side, the corresponding operations of the transmitter procedure are performed in reverse order. In particular, FIG. 6 shows a flow diagram of a decoding procedure 600 at a receiver for MLPC layer 0 codewords according to one or more embodiments.

The decoding procedure 600 starts decoding the layer 0 codewords when a receiver receives some data from a transmitter at operation 605. A demodulation block of the receiver provides, for example, a log-Likelihood Ratio (LLR) of the transmitted FEC codeword $C_i$ (e.g., one of FEC codewords 300) of layer 1. Thus, at operation 610, a decoder (e.g., inner FEC decoder such as a turbo, LDPC, polar, or convolutional decoder) of the receiver waits for a new or updated $LLR(C_i)$ for an FEC codeword 300 from layer 1. While an LLR demodulation output is used for this example, it will be understood that different types of demodulation outputs other than LLR may be applied.

In operation 615, in response to the decoder receiving an $LLR(C_i)$ from a demodulation block or from layer 1 packet coding process, the decoder attempts to decode the FEC codeword $C_i$ and determines whether the decoding is successful in operation 620 (i.e., whether the information bits $P_i$ are decoded successfully).

If this FEC codeword is not decoded successfully, the $LLR(C_i)$ for this FEC codeword $C_i$ is saved for later decoding, in operation 625, and operation 610 is repeated.

In operation 630, if this FEC codeword $C_i$ is decoded successfully (i.e., its information bits $P_i$ are decoded successfully), the decoded information bits $P_i$ are saved in memory, such as a buffer memory. Also, the corresponding FEC codeword $C_i$ is calculated and saved in the memory.

In operation 635, a determination is made whether all FEC codewords in a section (e.g., one of sections 310) are successfully decoded. If not all the FEC codewords in the section are successfully decoded, then operation 610 of the procedure is repeated using an updated LLR.

If all the FEC codewords in this section (e.g., one of sections 310) are successfully decoded, then in operation 640, the parity codeword (e.g., parity codeword 301 corresponding to the current section 310) for this section is saved in the memory, and all the FEC codewords corresponding to this parity codeword (or section) are released or cleared from the memory.

In operation 645, it is determined whether all the FEC codewords are successfully decoded for all sections 310 in layer 0. If all the FEC codewords are not successfully decoded for all sections 310, then the procedure moves back to operation 610 for an updated LLR. Otherwise, if all the FEC codewords are successfully decoded for all sections 310, the procedure for layer 0 ends.

Figure 7:
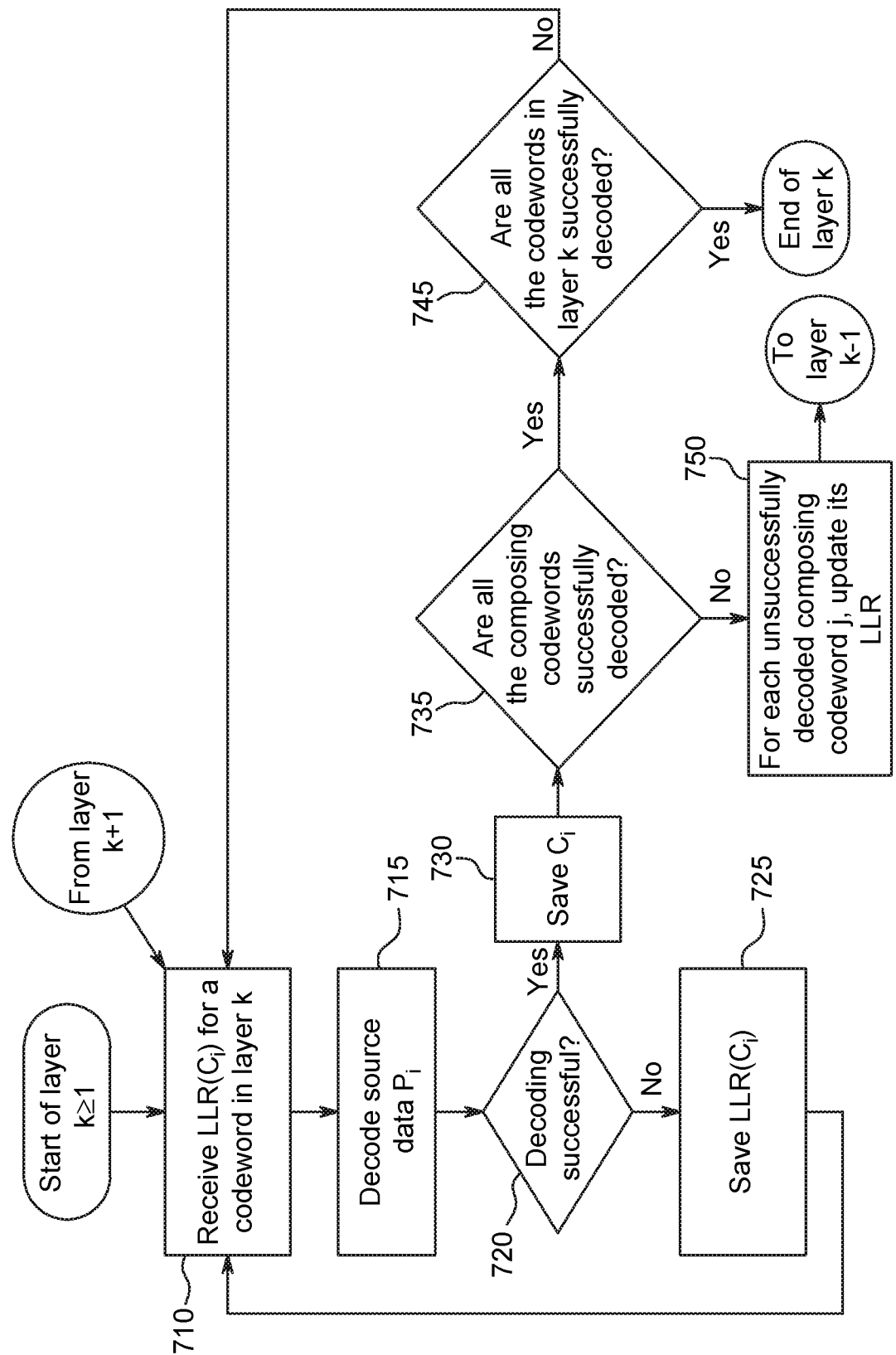
FIG. 7 shows a flow diagram of a decoding procedure for MLCP high (>0) layer codewords according to one or more embodiments.

FIG. 7 shows a flow diagram of a decoding procedure for MLCP high layer (i.e., greater than layer 0 (i.e., >0)) codewords according to one or more embodiments. More particularly, FIG. 7 shows the decoding procedure for packet coding at layer k, where $1 \leq k \leq N_l-1$ and ($N_l-1$) is the number of layers.

A demodulation block of the receiver provides, for example, an LLR for a parity codeword in layer k>0. Thus, at operation 710, a decoder (e.g., inner FEC decoder such as a turbo, LDPC, polar, or convolutional decoder) of the receiver waits for a new or updated $LLR(C_i)$ for a parity codeword in layer k from layer k+1. In operation 710, in response to receiving the LLR from the demodulation block or from layer k+1 packet coding process, this parity codeword is decoded, in operation 715, using the inner FEC decoder (e.g., turbo, LDPC, polar, etc.). In particular, as described above, source information bits P are being transmitted by a transmitter to the receiver, but first they are encoded to C as a FEC codeword by the transmitter. The receiver will demodulate the LLR of C, i.e., LLR(C). Then the decoder will try to obtain P based on the LLR(C).

If this parity codeword is not decoded successfully (i.e., if information bits $P_i$ are not decoded successfully) (see operation 720), then the LLR for this parity codeword is saved for later decoding and the procedure moves back to operation 710 (see operation 725).

If this parity codeword is decoded successfully to the source bits P, then the source bits P are re-encoded by the receiver to obtain $C_i^k$ which is then saved in memory $C_i^k$ (see operation 730). That is, the receiver performs the encoding operation as described above with respect to the transmitter, i.e., generating FEC codeword $C_i^k$ from source bits P again by an XOR operation. The receiver will save only the FEC codeword $C_i^k$ here. Note that this parity codeword $C_i^k$ at layer k>0 is generated by an XOR of several (lower layer) codewords $C_i^{k-1}$ at layer k-1. For example, a layer 2 parity codeword is derived from an XOR of layer 1 parity codewords. Similarly, a layer 3 parity codeword is derived from an XOR of layer 2 parity codewords. These lower layer parity codewords $C_i^{k-1}$ are also referred to as composing codewords. That is, the composing codewords are those codewords from layer k-1 used to generate the layer k parity codeword (e.g., by an XOR operation). Thus, the composing codewords may be FEC codewords or lower layer parity codewords depending on layer k.

If all the composing codewords (at layer k-1) are successfully decoded (see operation 735), then a check is performed as to whether all the codewords at layer k are successfully decoded (see operation 745). If so, the procedure ends. Otherwise, the procedure moves back to operation 710.

In operation 735, if not all the composing codewords (at layer k-1) are successfully decoded, then for each un-decoded composing codeword, the LLR is updated (see operation 750). This triggers the decoding procedures for layer k-1, which may begin again at either operation 610 or 710 depending on layer k.

There are multiple methods to update the LLR of a composing codeword. One or any combination of the following methods to update/calculate an LLR for MLPC may be applied.

In a first method to update/calculate an LLR for MLPC, soft combining of LLR may be performed. Provided that the parity codeword $C_p$ is the XOR of several composing codewords $C_1, \ldots, C_k$. Let $S \subseteq \{1, \ldots, k\}$ be the set of codeword indices which have been decoded successfully, and let $S^c = \{1, \ldots, k\} \setminus S$. Hence, the LLR is provided codewords with indices in $S^c$.

For all the successfully decoded FEC codewords and parity codewords, calculate $C_p \oplus C_{i:i \in S}$. This may be equal to the XOR of all the decoded codewords: $\oplus C_{i:i \in S^c}$. Then, the LLR is generated for $C_p \oplus C_{i:i \in S}$. Here, it is assumed that a function $\mathcal{F}$ is used to convert/map the hard bits ($C_p \oplus C_{i:i \in S}$) to its soft LLR values. This function may depend on the FEC coder, and/or the specific FEC decoding algorithms to use, and other factors. The resulting LLR is denoted by: $LLR(C_p \oplus C_{i:i \in S}) = \mathcal{F}(C_p \oplus C_{i:i \in S})$.

With $LLR(C_i), i \in S^c$, the saved LLR is denoted for each un-decoded codeword. For each un-decoded codeword $i \in S^c$, a function $\mathcal{G}$ is applied to generate its temporary LLR, i.e., $$LLR_t(C_i) = \mathcal{G}(LLR(C_p \oplus C_{j:j \in S}), LLR(C_j), j \in S^c \setminus i).$$

Finally, a temporary LLR is combined with the LLR used in the previous decoding of codeword $C_i$, i.e., $LLR^{update}(C_i) = \mathcal{H}(LLR(C_i), LLR_t(C_i))$.

In an example, assume k=4, S={1,2,3} with successfully decoded codewords $C_p$, $C_1$, $C_2$, $C_3$ and $C_4 = C_p \oplus C_1 \oplus C_2 \oplus C_3$. Since there is only one un-decoded codeword $\mathcal{F}$, may be applied such that bit '0' maps to infinite and bit '1' maps to negative infinite. The function $\mathcal{G}$ is a unity function, and the function $\mathcal{H}$ is the summation of two LLRs.

Consider another example with k=4 and S={1,2,3}. With the successfully decoded codewords $C_p$, $C_1$, $C_2$, there is $C_3 \oplus C_4 = C_p \oplus C_1 \oplus C_2$. Then, the corresponding LLR is given by $\mathcal{F}(C_p \oplus C_1 \oplus C_2)$ providing:

$$LLR_t(C_3) = \mathcal{G}(\mathcal{F}(F(C_p \oplus C_1 \oplus C_2), LLR(C_4)),$$

$$LLR_t(C_4) = \mathcal{G}(\mathcal{F}(C_p \oplus C_1 \oplus C_2), LLR(C_3)).$$

The updated LLR's are given by:

$$LLR^{update}(C_3) = \mathcal{H}(LLR(C_3), LLR_t(C_3)),$$

$$LLR^{update}(C_4) = \mathcal{H}(LLR(C_4), LLR_t(C_4)).$$

In a second method to update/calculate an LLR for MLPC, XOR-based LLR may performed. Provided the parity codeword $C_p$ is the XOR of several composing codewords $C_1, \ldots, C_k$ and given the observation of $C_p$ at the receiver, the receiver may perform any one or a combination of the following operations. The receiver may use $C_p$ to recover failed FEC codeword(s). The receiver may use $C_p$ to update the liability of each of FEC codewords $C_1, \ldots C_k$, and, thus, each FEC codeword may be updated. The receiver also may perform iterative decoding based on the procedure explained above. The receiver may also use the higher layer parity codeword $C_p$ to update the liability of the lower layer parity codewords.

The receiver may update the liability (e.g., LLR, probability, etc.) of $C_1, \ldots, C_k$, and $C_p$. An algorithm may be used for the update. An example and a generalized algorithm is described below.

For example: $C_p = C_1 \oplus C_2$, given the observation (e.g., could be from demodulator, from the previous, or the last iteration of decoding) of $C_p$, C2, the liability of C1 may be updated. With the parity check constrains, it may be concluded that:

$$C_1 = 0 \text{ if } \{C_2, C_p\} = \{0, 0\} \text{ or } \{C_2, C_p\} = \{1, 1\}$$

$$C_1 = 1 \text{ if } \{C_2, C_p\} = \{1, 0\} \text{ or } \{C_2, C_p\} = \{0, 1\}.$$

The probability of $C_1$ is described below:

$$P(C_1=0)=P(C_2=0)P(C_p=0)+P(C_2=1)P(C_p=1) \quad \text{Equation (1)}$$

$$P(C_1=1)=P(C_2=1)P(C_p=0)+P(C_2=0)P(C_p=1). \quad \text{Equation (2)}$$

In this way, the probability of $C_1$ may be updated. Similarly, the probability of $C_2$ may be updated by exchanging the position of $C_2$ and $C_1$ in Equation (1) and Equation (2). $C_p$ may be updated in a similar way because the parity check constrain may be rewritten to $C_1 = C_p \oplus C_2$. Equation (1) and (2) may be simplified as shown below:

$$\Delta P_1 = \Delta P_2 * \Delta P_p, \quad \text{Equation (3)}$$

where $\Delta P_k = P(C_k=0) - P(C_k=1)$.

By using Equation (3), the above mentioned algorithm may be expended to any parity check constraints (e.g., more than two FEC codewords case).

In another example, three FEC codewords $C_p = C_1 \oplus C_2 \oplus C_3$, using $\Delta P_1 = \Delta P_2 * \Delta P_3 * \Delta P_p$ update the probability of $C_1$ and further decode $C_1$.

The algorithm may be implemented with LLRs other than the probabilities, as described below.

In examples and equations described above, Cp and Ck are distinguished. However, due to the nature of the XOR operation, the parity check constraint may be rewritten in a more general way:

$$\Sigma_k \oplus C_k = 0.$$

Here one of the $C_k$ may represent the parity check codeword (i.e., parity codeword or composing codeword), while the rest of $C_m$ ($m \neq k$) may represent the FEC codeword. With this expression, there is no need to distinguish parity check codeword and FEC codeword anymore. Particularly, the $n^{th}$ bit in each codeword may be denoted by $C_k^n$, thus:

$$\Sigma_k \oplus C_k^n = 0.$$

The LLR of a bit $C_k^n$ may be denoted as:

$$LLR(C_k^n) = L(C_k^n) = \log P(C_k^n=0) - \log P(C_k^n=1).$$

The updated LLR of a bit $C_k^n$ is of a bit $L'(C_k^n)$. Using tan h $$\left[\frac{1}{2}\log\left(\frac{p0}{p1}\right)\right] = p0 - p1$$

and Equation (3), the following equation may be derived:

$$\tan h(L'(C_k^n)/2) = \Pi_{m \neq k} \tan h(L(C_m^n)) \quad \text{Equation (4)}$$

Equation (4) may be simplified by factoring the LLR values to its sign and magnitude, which may result:

$$L'(C_k^n) = \Pi_{m \neq k} \text{sign}(L(C_m^n)) \Phi(\Sigma_{m \neq k} \Phi(\text{abs}(L(C_m^n)))),$$

where $$\Phi(x) = -\log\left[\tanh\left(\frac{x}{2}\right)\right] = \log\left(\frac{e^x+1}{e^x-1}\right).$$

In another embodiment, a multi-tier outer-code/inner-code HARQ procedure may be used for MLPC. For example, a tier-1 inner-code HARQ procedure may be executed based on whether the inner decoding fails or succeeds, and a tier-2 outer-code HARQ procedure may be executed based on whether the outer decoding fails or succeeds.

Although multi-tier outer-code/inner-code HARQ procedure is applied for MLPC in this example, it may be used for any communication system with outer coding and inner coding with or without MLPC. The outer coding/decoding may be activated/enabled and deactivated/disabled by any signaling method described herein.

The outer coding/decoding may also be dynamically activated/enabled and deactivated/disabled based on inner decoding result or tier-1 inner-code HARQ acknowledgment.

Figure 8:
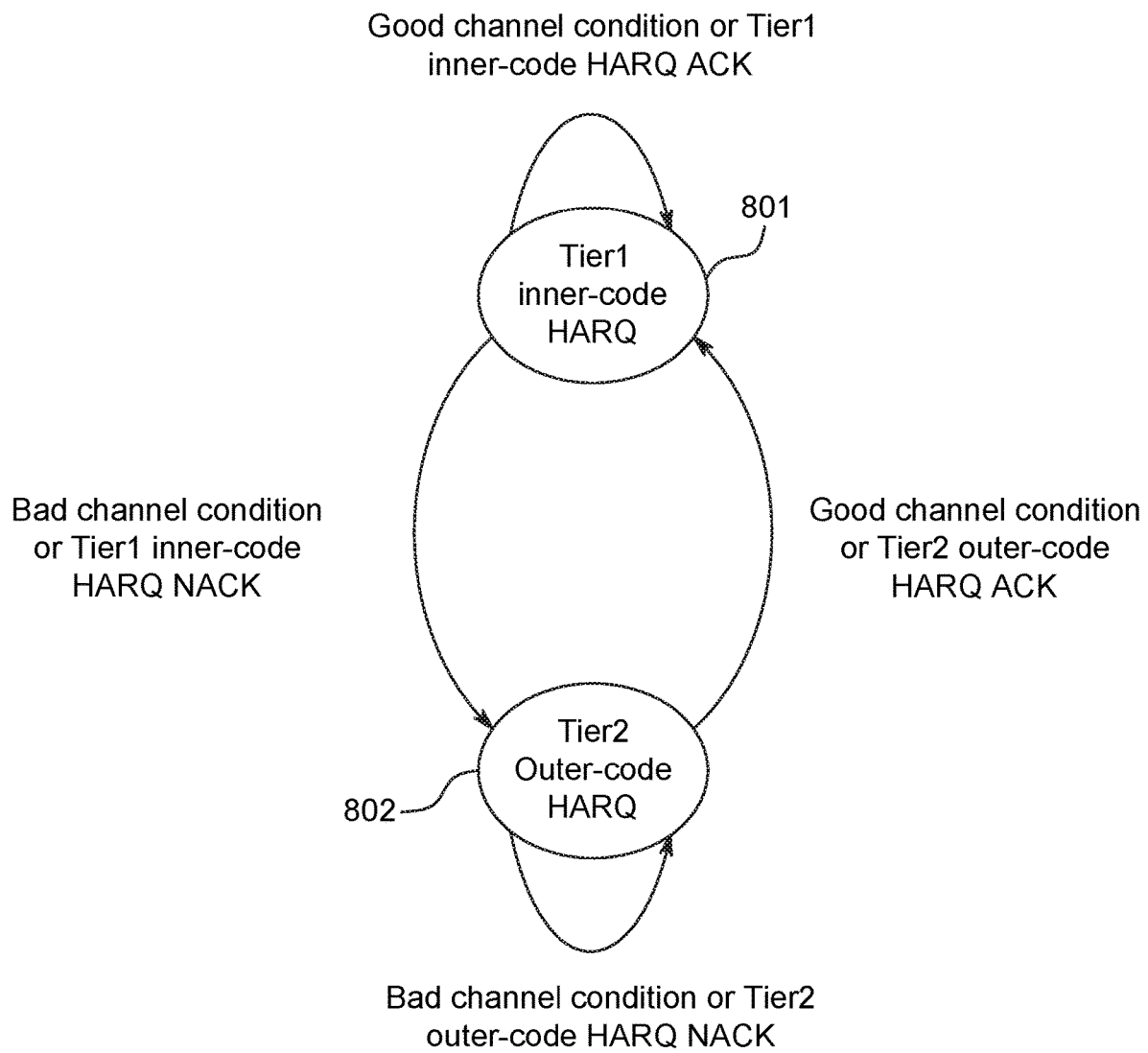
FIG. 8 illustrates a state machine of a multi-tier outer code/inner code hybrid automatic repeat request (HARQ) according to one or more embodiments.

FIG. 8 illustrates a state machine of a multi-tier outer code/inner code hybrid automatic repeat request (HARQ) according to one or more embodiments.

In a case of good channel conditions, the receiver may remain in or be configured to state 801. Here, if the inner decoding succeeds, a tier-1 inner-code HARQ ACK may be generated by the receiver and sent back to the transmitter, and it may be desired to disable/deactivate the outer coding/decoding for power saving and low latency.

In a case of bad channel conditions, the receiver may remain in or configured to state 802. Here, if the inner decoding fails, tier-1 inner-code HARQ NACK may be generated by the receiver and sent to the transmitter to request HARQ retransmission, and it may be desired to enable/active outer coding/decoding for further error correction and reliable communication. If outer decoding succeeds, the received tier-1 inner-code HARQ retransmission may be ignored or discarded to reduce the HARQ latency and soft-combining complexity. If the outer decoding fails, tier-2 outer-code HARQ NACK may be generated by the receiver and sent to the transmitter to request HARQ retransmission.

The receiver may switch from state 801 to state 802 upon detecting one or more bad channel conditions (e.g., where one or more channel conditions is not satisfactory according to one or more design parameters) or upon generating or transmitting a tier-1 inner-code HARQ NACK. The receiver may switch from state 802 to state 801 upon detecting one or more good channel conditions (e.g., where one or more channel conditions is satisfactory according to one or more design parameters), or when all channel conditions are satisfied, or upon generating or transmitting a tier-2 outer-code HARQ ACK.

Thus, an example implementation of multi-tier outer-code/inner-code HARQ procedure may be as follows:
IF inner decoding succeeds at the receiver:
Generate and feedback ACK to the transmitter; and
IF ACK feedback is continuous for K times, disable out coding.

K may be an integer number larger than 0, which may be determined by the target block error rate (BLER), latency and/or complexity.

The example implementation of the multi-tier outer-code/inner-code HARQ procedure may further be as follows:

IF inner decoding fails at the receiver:
  IF soft-combining is supported, preserve the failed data in memory; ELSE (IF soft-combining is not supported), discard the failed data.
  Generate and feedback NACK to the transmitter;
  Activate outer decoding; and
  IF outer decoding fails, generate and feedback NACK to the transmitter; ELSE (IF outer decoding succeeds), discard the received retransmission packet requested by tier 1 inner code HARQ.

The acknowledgements (i.e., either positive or negative) for each section of the transport block may be provided in a multi-bit acknowledgement message that includes the acknowledgements for all sections.

According to another embodiment, an MLPC HARQ procedure may be as follows. For the k-th layer, $0 \le k \le N_l-1$, three MLPC-layer dependent feedback states may be proposed as: ACK, $NACK1_k$, and $NACK2_k$.

In the ACK state, the current transmission packet is correctly decoded, so no retransmission is requested, and a new transmission packet may be sent by the transmitter to the receiver.

In the $NACK1_k$ state, a retransmission FEC codeword or a parity codeword at layer k may be sent by one or any combination of methods proposed below.

In the $NACK2_k$ state, a parity codeword at layer (k+1) may be sent by using one or any combination of the methods described below.

The above states (ACK, NACK1, NACK2) apply to each section at each layer. Hence, for a given layer, the number of selected, fed back or reported states is equal to the number of sections of this layer. Suppose there are X sections in a layer. Since two bits are needed to represent three states for a section, a total of 2X bits will be needed for the ACK/NACK feedback at this layer. Some optimization on the total number of bits could be applied, by making a full use of the two bits per section.

Based on three feedback states above, layer-based or section-based MLPC HARQ may determine which FEC codeword and/or which parity codeword to be retransmitted according to the following methods.

For the k-th layer, $0 \le k \le N_l-1$, compute $PER_k$ based on all failed codewords in the kk-th layer (e.g., based on FEC codewords for the zero-th layer, and based on the parity codewords for the k-th layer).

The feedback acknowledgement is generated as follows. An ACK is generated if $PER_k=0$ (i.e., correctly received all codewords). A $NACK1_k$ is generated if $PER_k > PER_{TH_k}$, where $PER_k$ is the calculated (realized) PER for a k layer transmission and $PER_{TH_k}$ is the PER threshold for layer k). A $NACK2_k$ is generated if $0 < PER_k \le PER_{TH_k}$. The $PER_{TH_k}$ may be the same or different for different k layers. Optionally, $PER_{TH_1}$ may be different from $PER_{TH_k}$ for $1 \le k$. On the other hand, $PER_{TH_k}$ may be the same for $1 \le k$ since an FEC codeword may have a different error correction performance from XOR operation based parity codeword.

In the case of layer 0, if $PER_0 > PER_{TH_0}$, this scheme may reduce to the coded block (CB) based HARQ retransmission and this results in the NACK1 state. If all sections are in the NACK1 state, then, one or more CBs or the whole associated transport block (TB) will be retransmitted.

If $PER_0=0$, then the receiver transmits a feedback ACK and no retransmission of FEC codewords and parity codewords may be needed.

If $0 < PER_0 \le PER_{TH_0}$, the feedback state is configured to the NACK2 state. In this case, to avoid the signaling overhead indicating the individual failed CBs and to reduce the associated latency, the above proposed MLPC HARQ procedure may be applied. Alternatively, CB-based HARQ retransmission may be applied. Alternatively, TB-based HARQ retransmission may be used when setting $PER_{TH_o}=0$.

For a special case of $N_l=1$, i.e., only the zero-th layer exists, and $PER_{TH_o}=0$, i.e., the NACK2 state does not exist, then 1 bit ACK/NACK per section (or group) may be used to indicate if all the code blocks within the section (or group) are decoded correctly. If it is a NACK for a section, then all the code blocks in this section will be re-transmitted. If a TB contains multiple sections, then multiple section-based (or group-based) ACK/NACK will be provided as feedback. Overall, the number of ACK/NACK bits generated for a TB is equal to the number of sections for this TB in case 1 bit ACK/NACK per section (or per group) is used.

The above scheme could be extended to more than 3 states (ACK, NACK1, NACK2). For example, an additional state of NACK3 may be used, where the NACK3 corresponds to the condition $PER'_{TH_k} < PER_k < PER_{TH_k}$ and NACK2 corresponds to the condition $0 < PER_k \le PER'_{TH_k}$. Here, different PER thresholds are set by $PER'_{TH_k} < PER_k < PER_{TH_k}$. When the transmitter receives NACK2 from the receiver, the transmitter may be configured to send a single parity codeword. When the transmitter receives NACK3, it may be configured to send more than one parity codeword. When the transmitter receives NACK1, it may be configured to resend all the codewords in the section (or group). This simple extension uses two bits ACK/NACK per section, i.e., '00' may correspond to ACK, '01' may correspond to NACK1, '10' may correspond to NACK2, and '11' may correspond to NACK 3.

It will be appreciated that the acknowledgements (i.e., either positive or negative) for each section of the transport block may be provided in a multi-bit acknowledgement message (e.g., a block ACK message) that includes the acknowledgements for all sections.

For a first transmission of MLPC HARQ, any one or a combination of the following methods may be used.

In a first method, only coded inner codewords are transmitted. There are no parity codewords transmitted for low overhead.

In a second method, a multi-layer parity codeword is transmitted with the size equal to the number of the largest transmitted bits of all FEC codewords. Accordingly, the parity codeword may use the same coding rate as the lowest coding rate of all FEC codewords. This may also be applied to generate higher layer parity codeword from lower layer parity codewords.

That means parity for all the bits of codewords are included. In case of different transmitted lengths of codewords, zero padding may be done to the codewords with less number of bits before generating the multi-layer parities. The padded zeros may not be transmitted and are used for the parity computation, which mathematically produces the same results as an XOR operation.

Figure 9:
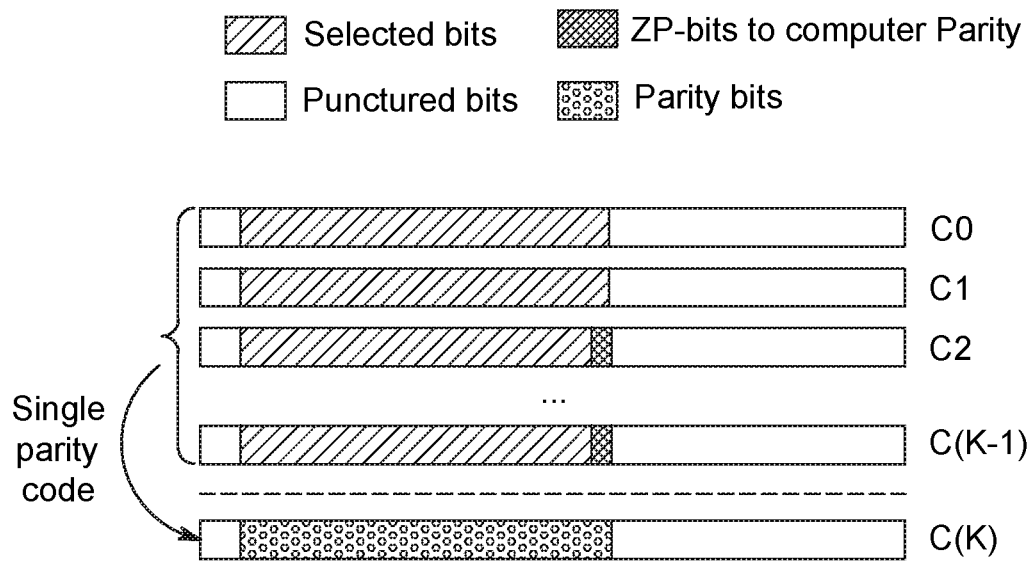
FIG. 9 shows a diagram of a multi-layer parity codeword according to one or more embodiments.

FIG. 9 shows a diagram of a multi-layer parity codeword according to one or more embodiments. In particular, zero padding (ZP) bits are added to the FEC codewords C2 to C(K−1) prior to generating the multi-layer parity codeword at C(K) such that all codewords C0-C(K−1) have the same number of bits.

Figure 10:
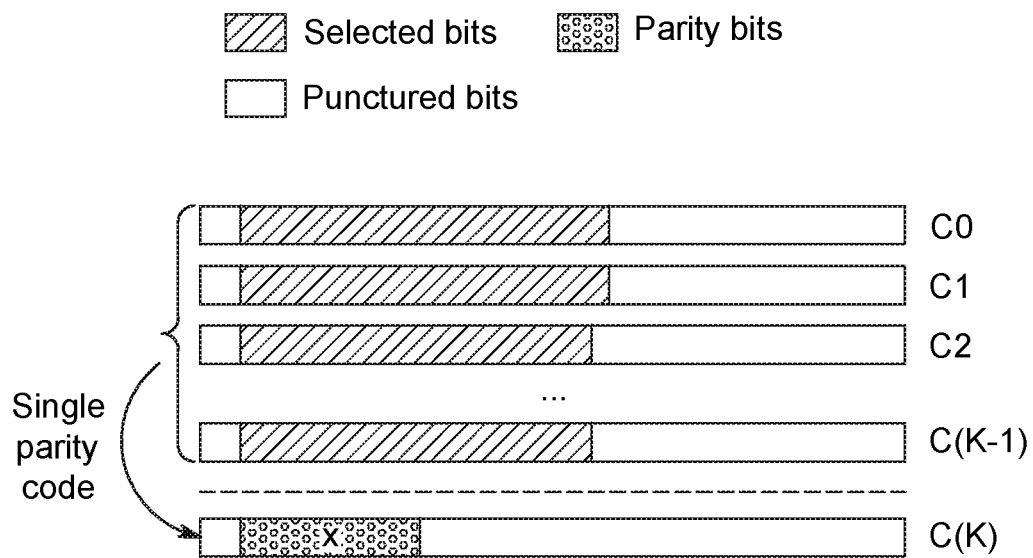
FIG. 10 shows a diagram of another multi-layer parity codeword according to one or more embodiments.

In a third method, a multi-layer parity codeword is transmitted with a size smaller than the FEC codewords. FIG. 10 shows a diagram of another multi-layer parity codeword according to this embodiment. As a result of the smaller size of the parity codeword, the parity codeword may use the higher coding rate than FEC codewords. This may also be applied to generate higher layer parity codeword from lower layer parity codewords.

Provided 'x' is a number of parity to be computed and transmitted in a localized fashion, the 'x' number of parity bits may be computed from the beginning of the transmitted FEC codeword bits. The 'x' may be size of smallest number in case of different transmitted bits. The 'x' may also be a smaller number dependent on the code-rate currently being used.

For example, a small x may be used for a high-code-rate and a high code-rate may be used in a high-SNR channel thereby sending a fewer number of multi-later parity bits in order to reduce overhead. A high value of 'x' may be used in low SNR channels thereby generating and transmitting a large number of parity bits.

Figure 11:
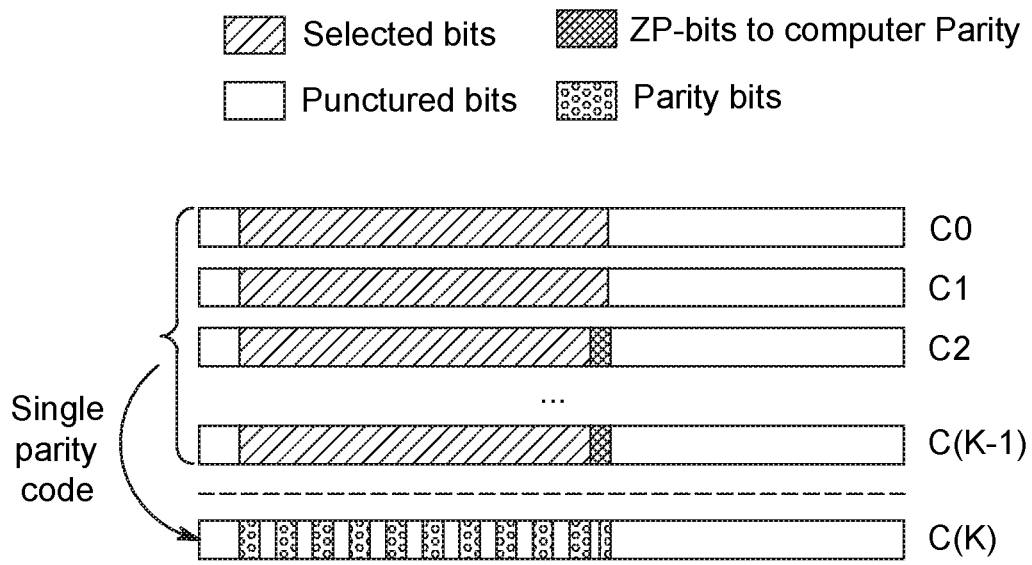
FIG. 11 shows a diagram of a another multi-layer parity codeword according to one or more embodiments.

FIG. 11 shows a diagram of a another multi-layer parity codeword according to one or more embodiments. Here, it may be possible to generate and transmit multi-layer parity for pseudo randomly selected 'x' number of bits as shown in FIG. 11 by one or any combination of the following methods.

This may be done by using patterned selection. An example of such a pattern may be [1, 0], which may be applied and illustrated by selecting bits as [1,3,5,7 . . . .]. The pattern may be [1 1 1 0], which may be applied and illustrated by selecting bits as [1,2,3, 5,6,7 9,10,11, 13 . . . ]. Other examples for such a pattern include, but are not limited to, parity [1, 1, 1, 0, 0, 1] and parity [1, 1, 1, 0, 0, 1, 1, 0, 0, 1]. It may also be possible to first interleave the codewords identically and then select first x bits for the parity. This also generates a pseudo random pattern for pruned parity.

Thus, as illustrated in FIG. 11, zero padding (ZP) bits are added to the FEC codewords C2 to C(K−1) prior to generating the multi-layer parity codeword at C(K) such that all codewords C0-C(K−1) have the same number of bits. In addition, the parity codeword is patterned according to the selected pattern.

For retransmissions, any one or a combination of the following methods may be used.

In a first method, only the FEC codewords which have failed are retransmitted. Depending on redundancy versions (RV) and/or coding rate, different bits of the FEC codeword may be set. The different transmitted versions of the packet containing different combinations of systematic and FEC bits are called redundancy versions (RVs). For example, LTE uses four RVs that are repeatedly sequenced through until the packet is received correctly or until a maximum number of retransmissions have been sent, at which time HARQ declares a failure and leaves it up to ARQ running in radio link control (RLC) to try again.

In a second method, the failed FEC codeword(s) and the first layer parity which is associated the failed FEC codeword(s) (e.g., within the same section) are retransmitted. Depending on the RV number different bits of FEC codeword and corresponding part of parities may be sent. Different FEC codeword bits and parity bits may be sent. Both may be selected independently as a function of the RV number. The selection of these bits may be done with predefined pattern or interleaver followed by truncation as described in previous paragraph. Alternatively, all the lower layer parities may be sent and a different part of FEC codeword is sent as a function of the RV number.

If only chase combining is possible at receiver, all the above methods are still valid assuming the same RV number is sent in each subsequent HARQ retransmission.

In the first two methods, if multi-layer parity is transmitted, it is computed along with new blocks being transmitted.

In a third method, retransmitted multi-layer parities are used to reconstruct the lower layer parity codeword, and hence to recover FEC codeword(s). The multi-layer parities may span different sessions. Further, the parities may be only combined if the parities were generated using identical codewords.

HARQ transmission for MLPC may use one or any combination of the following methods. HARQ codeword (bits) may be generated with any method described in above. Adaptive HARQ or non-adaptive HARQ may be used for the transmission. Non-adaptive HARQ with the same modulation and coding scheme (MCS) and/or the same resource which may denote the resource in one or any combination of time, frequency, spatial and/or code (or signal) domains. Adaptive HARQ may use different MCS for different retransmission over the same resource, or the same MCS over different resource, or different MCS over different resource.

For HARQ soft-combining, any one or a combination of the following methods may be used: chase combining for small buffer size; if different retransmissions use different RV, IR combining may perform better at the cost of buffer size; parities may be only combined if they were generated with same codewords; new parities may be used to reconstruct a newly received codeword only and may not be combined; and HARQ combining may use one or any combination of the combining methods described above.

In addition, there may be signaling to support MLPC HARQ. Parity codewords are specific to the codewords used to generate it. Hence, they may be only combined if they were generated with the same codewords.

When transmitting these multi-layer parity codewords, any one or a combination of the following information may be signaled: number of layers of parity codewords used; the section ID to which the multi-layer parity codeword corresponds; and the resource ID on which the data is transmitted. Additionally, if it is piggy backed over a shared channel with new information bits and new HARQ process, the receiver may also need the bit-offset and number of bits used for these multi-layer parity codewords (i.e., the retransmitted parity codewords), where this may be indicated explicitly for each layer individually. Alternatively, the bit-offset and a total number of parity bits are indicated explicitly for all layers. Information for each layer may be computed implicitly. This is possible if predefined number of parity is used for each layer or predefined configuration is known to transmitter and receiver. The information (e.g., section ID, resource ID, bit-offset and number of bits, etc.) may be part of downlink control information (DCI)/uplink control information (UCI), and this DCI/UCI may be transmitted as part of uplink or downlink control channel or shared channel.

There may be signaling to activate/deactivate the outer coding/decoding. Various signaling methods are provided below to activate/deactivation the outer coding/decoding.

In a first method to activate/deactivate the outer coding/decoding, ACK-based implicitly activation/deactivation of outer code is performed as described above.

Figure 12:
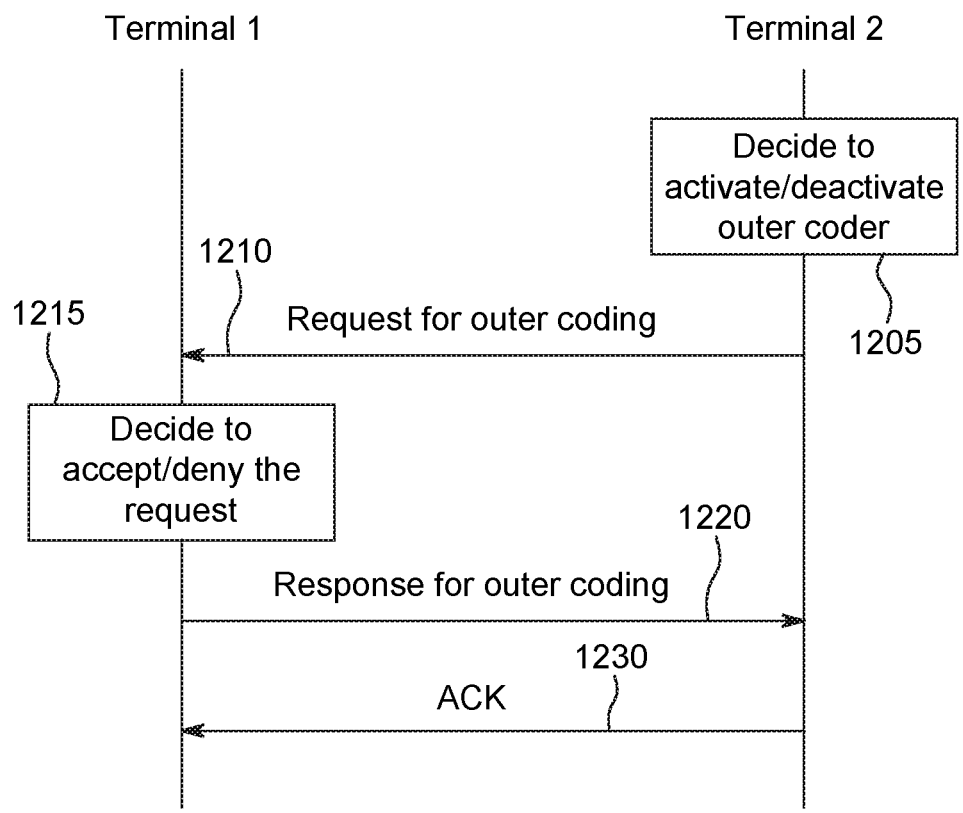
FIG. 12 shows a diagram of a call flow for activating and deactivating the outer coding according to one or more embodiments.

In a second method to activate/deactivate the outer coding/decoding, the outer code is explicitly activated/deactivated. FIG. 12 shows a diagram of a call flow for activating and deactivating the outer coding according to this embodiment. For example, suppose two terminals communicate to each other and, initially, the outer coding is not activated, and only inner coding is applied. If terminal 2 (e.g., a receiver) finds that the inner codes do not achieve good decoding performance according to meeting a desired performance parameter, terminal 2 may decide to activate its outer coder (1205) send a request 1210 to terminal 1 (e.g., the transmitter) to activate the outer coding. Terminal 1 may accept/deny the request (1215) to activate its own outer coder by sending back a response 1220. Terminal 2 may further acknowledge the reception of this response by sending an ACK 1230. Then, both terminals 1 and 2 may synch up to activate the outer coding.

The decision to activate the outer coding may be due to the high blocker error rates (after HARQ). It may also depend on the data QoS requirement. For example, for data with relaxed latency requirements, the outer coding could be activated. The starting time for activating outer coding can be obtained either in the initial request message or in the subsequent responding message.

Similarly, if a terminal finds that the outer codes are no longer needed, it may send a request to the other terminal to deactivate the outer coding. The other terminal may accept/deny the request by sending response back. The first terminal could acknowledge the reception of this response. Then, both terminals may synch up to deactivate the outer coding.

The decision to deactivate the outer coding may be due to the low blocker error rates (after HARQ). It may also depend on the data QoS requirement. For example, for data with tight latency requirements, the outer coding could be deactivated. The starting time for deactivating outer coding can be obtained either in the initial request message or in the subsequent responding message.

In addition, a channel coding selection scheme for a data channel is further disclosed. In existing wireless communication systems, the channel coding is pre-defined in the 3GPP specification. For example, usage of a channel coding scheme and coding rate for transport channels (TrCHs) (e.g., UL-SCH, DL-SCH, paging channel (PCH), multicast channel (MCH) and broadcast channel (BCH) for LTE systems is shown in Table 1. It is seen from Table 1 that both UL-SCH and DL-SCH are based on the same coding scheme: turbo coding. In other words, the UL and DL data channel are using identical channel codes.

TABLE 1

| TrCH | Coding scheme | Coding rate |
|---|---|---|
| UL-SCH | Turbo coding | 1/3 |
| DL-SCH | | |
| PCH | | |
| MCH | | |
| BCH | Tail biting convolutional coding | 1/3 |

However, the hardware restrictions on transmitters and receivers may be different. For example, an eNodeB could have very strong computational power while an mMTC device may have limited computational power due to power consumption and cost/complexity restrictions. This makes the decoupling of DL and UL coding schemes possible.

In a first method of channel coding selection for a data channel, the DL and UL coding schemes may be de-coupled. The de-coupling of DL and UL coding schemes (e.g., LDPC coding, turbo coding, polar coding, and convolutional coding) may be done in new radio systems and beyond.

Specifically, a DL coding scheme may be selected based on the decoding complexity, while UL coding scheme can be selected based on the decoding performance, as the decoding complexity may of less concern to the eNodeB. For example, having good decoding performance may be important in the UL because it results in enhanced link budget or it may have less power consumption at the WTRU.

The channel coding may be selected based on one or any combination of the following criteria. For UL and DL, different channel coding schemes and/or coding rate may be selected for a WTRU in order to reduce the implementation complexity and power consumption. For UL and DL, different channel coding schemes and/or coding rates may be selected for the eNodeB in order to improve the performance, reduce latency and/or increase flexibility such as variable code length, code rate, HARQ (as applicable for particular scenarios).

In a another method of channel coding selection for a data channel, the channel coding may depend on the WTRU category and/or the combination WTRU category and UL/DL. Therefore, it is possible to specify a WTRU's capability in terms of its supported coding schemes and coding rates. This specification can be contained in WTRU capability information element (IE), which may be implicitly indicated by WTRU category. For example, a new field may be included in a WTRU's capability IE to indicate the coding schemes/rates for UL and/or DL.

Thus, based on the WTRU capability IE, an eNodeB may select coding schemes/rates for UL and/or DL and send configuration information regarding the selected coding schemes/rates to the WTRU which implements the set configuration. The selection may also be adapted dynamically by the eNodeB based on current UL and/or DL channel conditions.

An example channel coding scheme and coding rate for WTRU UL/DL is shown in Table 2.

TABLE 2

| WTRU category | UL coding scheme | UL coding rate | DL coding scheme | DL coding rate |
|---|---|---|---|---|
| X1 | LDPC | 1/3, 1/2 | Convolutional | 1/6, 1/3 |
| X2 | Polar | 1/3, 1/2, 5/6, 8/9 | Convolutional | 1/6, 1/3 |
| X3 | Turbo | 1/3 | Polar | 1/12, 1/3 |

Category X1 may support DL convolutional coding with coding rates 1/6 and 1/3. This may be due to the low decoding complexity and power consumption. While for UL, it supports LDPC coding with coding rate 1/3 and 1/2 due to its high decoding performance: low decoding latency due to parallel processing, high reliability due to the lack of error floor.

Category X2 may support DL convolutional coding with coding rates 1/6 and 1/3, due to its low decoding complexity and power consumption. While for UL, it supports polar coding with coding rates 1/3, 1/2, 5/6, 8/9. This may be due to the flexibility rates of polar code, and its high performance at higher coding rates.

Category X3 may support DL polar coding with coding rates 1/12 and 1/3. This is because the decoding speed is not an important factor for the application scenario. It could support turbo coding with coding rates 1/3 for UL. This may be due to the relaxation of the highly reliability, as turbo codes are known for some error floor.

In a another method for channel coding selection for a data channel, the channel coding selection scheme may depend on block size and/or the combination of block size with WTRU category and/or UL/DL. Besides the UL and DL, the channel coding schemes may also depend on the block size. In an example, a larger block size normally corresponds to higher code rates and higher data rates. Block size is related to MCS levels.

Based on current channel codes, LDPC codes have good performance at high coding rates and large block sizes. Due to the parallel decoding nature, LDPC codes have low implementation complexity and low decoding latency, implying high throughput. On the other hand, polar codes have shown good performance at small block sizes and low coding rates, while turbo codes have proven their advantages in the flexibility (especially in HARQ) and stable performance.

Considering the features of the above codes, the block size (or MCS level) may be introduced in the channel codes partition criteria. For example, LDPC codes may be used for large block size and polar codes may be used for small block size in response to their respective performance region. Here, the implementation complexity of polar codes may not be an issue when it is used for small block size. In another example, LDPC codes are used for large block size and turbo codes are used for small block size due to its stable performance.

The block size, jointly with UL/DL and WTRU category, may be used for channel codes partition criteria. For example, for certain WTRU categories where high throughput is an important consideration, LDPC code may be used for large block size for both UL and DL due to its high throughput and good performance. Also, polar code may be used for small block size for DL due to its good performance, while turbo codes may be used for small block size for UL due to its proven flexibility and stable performance. For another WTRU category where the energy efficiency is the main design criteria, LDPC code may be used for DL due to its low implementation complexity and polar code may be used for UL due to its good performance and enhanced link budget.

For another WTRU category where the latency is the main design criteria, LDPC code may be used for DL due to its fast decoding algorithm, while turbo code can be used for UL due to its stable performance. Table 3 shows some example channel coding schemes separated by WTRU category, UL/DL and block length.

TABLE 3

| WTRU category | UL coding scheme at large block length | UL coding scheme at small block length | DL coding scheme at large block length | DL coding scheme at small block length |
|---|---|---|---|---|
| X1 | LDPC | Polar | LDPC | Polar |
| X2 | LDPC | Turbo | LDPC | Polar |
| X3 | LDPC | Turbo | Polar | Polar |

Multiple use cases were introduced to NR, such as eMBB, URLLC and mMTC. The selection of channel codes for different use cases may be different or the same. Different use cases may be associated with a different set of WTRU categories. The above channel code selection scheme based on WTRU category may be applied to different use cases accordingly.

It will be appreciated that any of the above methods for selecting channel coding may be implemented separately or in combination.

A channel coding selection scheme for a control channel is provided such that above schemes describing channel coding for a data channel may be also applied to control channel.

Table 4 shows the channel coding schemes and coding rates used for an LTE control channel for transmitting control information (e.g., DCI, control format indicator (CFI), HARQ indicator (HI), UCI, sidelink control information (SCI), etc.). It can be seen that different codes (e.g., tail-biting convolutional codes (TBCC), Reed-Muller codes, and Repetition codes) are used for different control information. This is because each code type has its application region, depending on block length and coding rate.

TABLE 4

| Control Information | Coding scheme | Coding rate |
|---|---|---|
| DCI | Tail biting convolutional coding | 1/3 |
| CFI | Block code | 1/16 |
| HI | Repetition code | 1/3 |
| UCI | Block code | variable |
|  | Tail biting convolutional coding | 1/3 |
| SCI | Tail biting convolutional coding | 1/3 |

Polar codes have shown good performance at very small block length and low coding rates. Polar codes may be used as a unified channel code for control information or a control channel. Or, polar codes could be used together with some other channel codes (e.g., repetition code) for a control channel so as to reduce the total number of channel codes for a control channel. For example, polar codes could be applied to DCI, CFI, UCI, and SCI, as well as other new types control information for NR, while HI may be based on repetition codes. An example usage of channel coding scheme and coding rate for control information is provided in Table 5. Another example usage of channel coding scheme and coding rate for control information is provided in Table 6.

TABLE 5

| Control Information | Coding scheme | Coding rate |
|---|---|---|
| DCI | Polar code | 1/3 |
| CFI | Polar code | 1/16 |
| HI | Repetition code | 1/3 |
| UCI | Polar code | variable |
|  | Polar code | 1/3 |
| SCI | Polar code | 1/3 |

TABLE 6

| Control Information | Coding scheme | Coding rate |
|---|---|---|
| DCI | Polar code | 1/3 |
| CFI | Polar code | 1/16 |
| HI | Polar code | 1/3 |
| UCI | Polar code | variable |
|  | Polar code | 1/3 |
| SCI | Polar code | 1/3 |

Further, although the solutions described herein consider NR or 5G specific protocols, it is understood that the solutions described herein are not restricted to this scenario and are applicable to other wireless systems as well.

Although features and elements are described above in particular combinations, one of ordinary skill in the art will appreciate that each feature or element can be used alone or in any combination with the other features and elements and that different embodiments and examples, and aspects thereof, may be used alone or in combination. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed is:

1. A method for performing multi-layer packet coding (MLPC) in a communication device, the method comprising:
   segmenting a data stream into a plurality of data segments;
   encoding each of the plurality of data segments into a respective forward error correction (FEC) codeword of a plurality of FEC codewords;
   performing first exclusive OR (XOR) operations on the plurality of FEC codewords to generate a plurality of first layer parity codewords;
   parsing the plurality of first layer parity codewords into a plurality of sections;
   performing at least one second XOR operation on the plurality of first layer parity codewords to generate at least one second layer parity codeword, including performing an XOR operation on the plurality of first layer parity codewords on a section-by-section basis to generate a second layer parity codeword for each of the plurality of sections; and
   transmitting at least one of: the plurality of FEC codewords, the plurality of first layer parity codewords, or the at least one second layer parity codeword.

2. The method of claim 1, further comprising:
   performing at least one third XOR operation on a plurality of second layer parity codewords to generate at least one third layer parity codeword, and
   wherein the transmitting includes transmitting at least one of: the plurality of FEC codewords, the plurality of first layer parity codewords, the plurality of second layer parity codewords, or the at least one third layer parity codeword.

3. The method of claim 1, further comprising:
   receiving a negative acknowledgement (NACK) corresponding to at least one failed FEC codeword of the transmitted plurality of FEC codewords; and
   transmitting at least one of the plurality of first layer parity codewords or at least one of the at least one second layer parity codeword in a hybrid automatic repeat request (HARQ) transmission responsive to the NACK.

4. The method of claim 1, further comprising:
   receiving a negative acknowledgement (NACK) corresponding to a failed FEC codeword of the transmitted plurality of FEC codewords; and
   retransmitting the failed FEC codeword in a hybrid automatic repeat request (HARQ) transmission responsive to the NACK; and
   transmitting a first layer parity codeword in the HARQ transmission, wherein the first layer parity codeword is associated with the failed FEC codeword.

5. The method of claim 1, further comprising:
   receiving a negative acknowledgement (NACK) corresponding to a failed first layer parity codeword of the transmitted plurality of first layer parity codewords;
   retransmitting the failed first layer parity codeword in a hybrid automatic repeat request (HARQ) transmission responsive to the NACK; and
   transmitting a second layer parity codeword in the HARQ transmission, wherein the second layer parity codeword is associated with the failed first layer parity codeword.

6. The method of claim 1, further comprising:
   receiving a first type negative acknowledgement (NACK1) in response to a packet error rate (PER) of a k-th layer transmission exceeding a PER threshold, wherein a transmission of the plurality of FEC codewords is a zero-th layer transmission where k=0, a transmission of the plurality of first layer parity codewords is a first layer transmission where k=1, and a transmission of the at least one second layer parity codeword is a second layer transmission where k=2; and
   retransmitting at least part of the k-th layer transmission responsive to the NACK1.

7. The method of claim 1, further comprising:
   receiving a second type negative acknowledgement (NACK2) in response to a packet error rate (PER) of a k-th layer transmission being greater than zero and equal to or less than a PER threshold, wherein a transmission of the plurality of FEC codewords is a zero-th layer transmission where k=0, a transmission of the plurality of first layer parity codewords is a first layer transmission where k=1, and a transmission of the at least one second layer parity codeword is a second layer transmission where k=2;
   transmitting a (k+1) layer transmission responsive to the NACK2.

8. A communication device configured to perform multi-layer packet coding (MLPC), the communication device comprising:
   at least one processor configured to segment a data stream into a plurality of data segments;
   an inner encoder configured to encode each of the plurality of data segments into a respective forward error correction (FEC) codeword of a plurality of FEC codewords;
   the at least one processor configured to perform first exclusive OR (XOR) operations on the plurality of FEC codewords to generate a plurality of first layer parity codewords;
   the at least one processor is configured to parse the plurality of first layer parity codewords into a plurality of sections;
   the at least one processor configured to perform at least one second XOR operation on the plurality of first layer parity codewords to generate at least one second layer parity codeword, including performing an XOR operation on the plurality of first layer parity codewords on a section-by-section basis to generate a second layer parity codeword for each of the plurality of sections; and
   a transmitter configured to transmit at least one of: the plurality of FEC codewords, the plurality of first layer parity codewords, or the at least one second layer parity codeword.

9. The communication device of claim 8, wherein:
the at least one processor is configured to perform at least one third XOR operation on a plurality of second layer parity codewords to generate at least one third layer parity codeword, and
wherein the transmitter is configured to transmit at least one of: the plurality of FEC codewords, the plurality of first layer parity codewords, the plurality of second layer parity codewords, or the at least one third layer parity codeword.

10. The communication device of claim 8, further comprising:
a receiver configured to receive a negative acknowledgement (NACK) corresponding to at least one failed FEC codeword of the transmitted plurality of FEC codewords,
wherein the transmitter is configured to transmit at least one of the plurality of first layer parity codewords or at least one of the at least one second layer parity codeword in a hybrid automatic repeat request (HARQ) transmission responsive to the NACK.

11. The communication device of claim 8, further comprising:
a receiver configured to receive a negative acknowledgement (NACK) corresponding to a failed FEC codeword of the transmitted plurality of FEC codewords,
wherein the transmitter is configured to:
retransmit the failed FEC codeword in a hybrid automatic repeat request (HARQ) transmission responsive to the NACK; and
transmit a first layer parity codeword in the HARQ transmission, wherein the first layer parity codeword is associated with the failed FEC codeword.

12. The communication device of claim 8, further comprising:
a receiver configured to receive a plurality of feedback bits, each feedback bit indicating an acknowledgement (ACK) or a negative acknowledgement (NACK) for a different one of a plurality of sections of a transport block, wherein a feedback bit indicates the NACK in response to at least one failed FEC codeword among transmitted FEC codewords in a corresponding section of the transport block, and
the transmitter is further configured to retransmit all the transmitted FEC codewords in the corresponding section responsive to the received NACK.

13. The communication device of claim 8, further comprising:
a receiver configured to receive a negative acknowledgement (NACK) corresponding to a failed first layer parity codeword of the transmitted plurality of first layer parity codewords,
wherein the transmitter is configured to:
retransmit the failed first layer parity codeword in a hybrid automatic repeat request (HARQ) transmission responsive to the NACK; and
transmit a second layer parity codeword in the HARQ transmission, wherein the second layer parity codeword is associated with the failed first layer parity codeword.

14. The communication device of claim 8, further comprising:
a receiver configured to receive a first type negative acknowledgement (NACK1) in response to a packet error rate (PER) of a k-th layer transmission exceeding a PER threshold, wherein a transmission of the plurality of FEC codewords is a zero-th layer transmission where k=0, a transmission of the plurality of first layer parity codewords is a first layer transmission where k=1, and a transmission of the at least one second layer parity codeword is a second layer transmission where k=2, and
wherein the transmitter is configured to retransmit at least part of the k-th layer transmission responsive to the NACK1.

15. The communication device of claim 8, further comprising:
a receiver configured to receive a second type negative acknowledgement (NACK2) in response to a packet error rate (PER) of a k-th layer transmission being greater than zero and equal to or less than a PER threshold, wherein a transmission of the plurality of FEC codewords is a zero-th layer transmission where k=0, a transmission of the plurality of first layer parity codewords is a first layer transmission where k=1, and a transmission of the at least one second layer parity codeword is a second layer transmission where k=2, and
wherein the transmitter is configured to transmit a (k+1) layer transmission responsive to the NACK2.

* * * * *